US006753964B2

(12) United States Patent
Chen et al.

(10) Patent No.: US 6,753,964 B2
(45) Date of Patent: Jun. 22, 2004

(54) AXIS DETERMINATION APPARATUS, FILM-THICKNESS MEASUREMENT APPARATUS, DEPOSITION APPARATUS, AXIS DETERMINATION METHOD, AND FILM-THICKNESS MEASUREMENT METHOD

(75) Inventors: Kai Chen, Kanagawa (JP); Fumihiko Omura, Kanagawa (JP); Akihito Minamitsu, Kanagawa (JP); Shizuo Nakamura, Kanagawa (JP)

(73) Assignee: Ulvac, Inc., Chigasaki (JP)

( * ) Notice: Subject to any disclaimer, the term of this patent is extended or adjusted under 35 U.S.C. 154(b) by 205 days.

(21) Appl. No.: 10/002,000

(22) Filed: Dec. 5, 2001

(65) Prior Publication Data

US 2002/0071129 A1 Jun. 13, 2002

(30) Foreign Application Priority Data

Dec. 7, 2000 (JP) ........................................ 2000-372456

(51) Int. Cl.[7] .............................................. G01B 11/00
(52) U.S. Cl. ...................................... 356/400; 356/614
(58) Field of Search ................................ 356/399, 400, 356/237.1, 237.2–237.5, 630–632, 426, 504, 614, 127; 324/229, 230; 427/9, 10; 250/231.14–231.17; 73/66

(56) References Cited

U.S. PATENT DOCUMENTS 5,822,213 A * 10/1998 Huynh ........................ 700/213
6,342,705 B1 * 1/2002 Li et al. ...................... 250/559.4
6,438,460 B1 * 8/2002 Bacchi et al. ................ 700/275
6,549,006 B2 * 4/2003 Le ............................... 324/230

* cited by examiner

Primary Examiner—Richard A. Rosenberger
Assistant Examiner—Vincent P. Barth
(74) Attorney, Agent, or Firm—Armstrong, Kratz, Quintos, Hanson & Brooks, LLP

(57) ABSTRACT

A film-thickness measurement apparatus of the present invention includes a lifter, a support mount, a light-emitting device, and a light-receiving device. With the center of a wafer staying in alignment with that of the support mount, the lifter places the wafer onto the surface of the support mount to determine the center of the wafer. While the wafer is being rotated about the center of the wafer, the light-emitting device irradiates the circumferential portion of the wafer with a laser beam, thereby allowing the position of a notch to be detected depending on whether or not the laser beam passes through the notch. This makes it possible to detect the positions of the notch and the center of the wafer to determine the center axis line of the surface of the wafer, thereby allowing the coordinates of a given position on the surface of the wafer to be defined in accordance with the center axis line and the center of the wafer. The thickness of the thin film on the surface of the wafer at the predetermined positions can then be determined.

11 Claims, 22 Drawing Sheets

AXIS DETERMINATION APPARATUS, FILM-THICKNESS MEASUREMENT APPARATUS, DEPOSITION APPARATUS, AXIS DETERMINATION METHOD, AND FILM-THICKNESS MEASUREMENT METHOD

BACKGROUND OF THE INVENTION

1. Field of the Invention

The present invention relates to an axis determination apparatus, a film-thickness measurement apparatus, a deposition apparatus, an axis determination method, and a film-thickness measurement method. More particularly, the present invention relates to an improvement of a technique that enables the determination of a film-thickness distribution by measuring the thickness of an electrically conductive film, at a plurality of points thereon, the film being deposited on a surface of a circular wafer.

2. Description of the Related Art

In many cases, it is customary to use generally circular wafers for the fabrication of semiconductor devices.

A wafer, designated by 150 in FIGS. 32(a) and (b), has a thin film deposited on a surface thereof. FIG. 32(b) is a cross-sectional view taken along line X—X of FIG. 32(a). The wafer 150, formed of silicon, having a circular shape, is provided with an electrically conductive thin film 152 deposited on a surface of a substrate 151, on part of the circumferential portion of which there is formed a triangular cut-away portion (hereinafter referred to as the notch) 153.

In order to determine whether the thin film 152 has been deposited in a constant thickness on the surface of the substrate 151, it is necessary to measure the thickness of the thin film 152 at a plurality of points on the surface of the wafer 150 to thereby determine the film-thickness distribution and know the extent of variations in the film thickness measured at each point.

Now, referring to FIGS. 33(a) and (b), a step height method as one of a prior-art method for determining a film-thickness distribution is described below. FIG. 33(b) is a cross-sectional view taken along Y—Y of FIG. 33(a). In the step height method, the thin film 152 is deposited on the surface of the wafer 150, which is then taken out of the deposition apparatus. Subsequently, the thin film 152 is etched at predetermined positions on the surface of the wafer 150 (i.e., at the center of the wafer 150 and at both ends of center axis lines of the surface of the wafer). A plurality of openings $156_1$–$156_5$ are thus formed to expose the surface of the substrate 151, as shown in FIG. 33(a). Thereafter, a stylus 171 is drawn near each of the openings $156_1$–$156_5$ to measure the step height between each of the openings $156_1$–$156_5$ and the electrically conductive thin film on a portion other than on the openings $156_1$–$156_5$, thereby determining the thickness of the thin film near each of the openings $156_1$–$156_5$ and the film-thickness distribution.

In the step height method, it is necessary to take the wafer 150 once out of the deposition apparatus to etch the aforementioned predetermined position and thereby form an opening, and thereafter draw the measurement stylus near the opening. Accordingly, there existed a problem of making the process considerably complicated.

SUMMARY OF THE INVENTION

The present invention was developed to solve the aforementioned drawbacks of the prior art. It is therefore an object of the present invention to provide a technique, which enables the accurate determination of the center axis of a circular substrate in a short time and the precise determination of the film-thickness distribution of a thin film deposited on the substrate surface.

To solve the aforementioned problems, the present invention provides an axis determination apparatus for determining a center axis line of a surface of a circular substrate. The axis determination apparatus comprises a support mount for supporting the substrate placed on a surface thereof, a drive mechanism for rotating the support mount in a plane containing the surface of the support mount, a light-emitting device disposed near the circumferential portion of the support mount, and a light-receiving device disposed, opposite to the light-emitting device, near the circumferential portion of the support mount. The light-emitting device is adapted to emit a beam of light to the light-receiving device.

The axis determination apparatus according to the present invention is such that the light-receiving device is disposed so as to receive the beam of light emitted by the light-emitting device through a notch provided on the circumferential portion of the substrate when the notch stays between the light-emitting device and the light-receiving device.

The present invention also provides an axis determination apparatus, for determining a center axis line of a surface of a circular substrate, comprising a support mount for supporting the substrate placed on a surface thereof. The axis determination apparatus further comprises a lifter, including a support member formed generally in a shape of a cube arranged on a circumference with a center of the support mount and a projected member projected towards the center under the support member, for supporting the substrate with a circumferential portion of the substrate sitting on the projected member. The axis determination apparatus further comprises a lifting mechanism for hoisting and lowering the lifter near the support mount. The axis determination apparatus is such that the support member is provided with an inclined surface sloped towards the projected member, and the lifter, when lowered below the support mount while supporting the substrate, transfers the substrate onto the surface of the support mount.

Furthermore, the axis determination apparatus according to the present invention is such that the substrate is clamped against the support mount.

Furthermore, the present invention provides a film-thickness measurement apparatus comprising an axis determination apparatus for determining a center axis line of a surface of a circular substrate and a measurement apparatus for measuring a thickness of an electrically conductive thin film formed on the surface of the substrate. The axis determination apparatus includes a support mount for supporting the substrate placed on a surface thereof, a drive mechanism for rotating the support mount in a plane containing the surface of the support mount, a light-emitting device disposed near a circumferential portion of the support mount, and a light-receiving device disposed, opposite to the light-emitting device, near the circumferential portion of the support mount, the light-emitting device being designed to emit a beam of light to the light-receiving device. The measurement apparatus determines a measurement position on the surface of the substrate at the measurement position in accordance with the center axis line determined by the axis determination apparatus and measures the thickness of the electrically conductive thin film at the measurement position.

Furthermore, the film-thickness measurement apparatus of the present invention is such that the measurement apparatus comprises a film-thickness sensor, a power source, and a measurement device. The film-thickness sensor includes a measurement coil. The power source applies an AC voltage to the measurement coil when the substrate is in close proximity to the measurement coil to generate an eddy current in the electrically conductive thin film on the surface of the substrate. The measurement device is designed to measure a signal generated in the measurement coil by an effect of the eddy current.

Furthermore, the film-thickness measurement apparatus according to the present invention is such that the film-thickness sensor comprises a reference coil and two reference resistors. The reference coil is connected in series to the measurement coil and arranged to stay farther away from the substrate than the measurement coil when the measurement coil faces the substrate. The two reference resistors are connected in series to each other to form a serially-connected circuit, which is connected in parallel to the serially-connected circuit of the measurement coil and the reference coil. The measurement device is designed to measure the potential difference between the connection of the measurement coil and the reference coil and the connection of the two reference resistors as a signal generated in the measurement coil when an AC voltage is applied across the serially-connected circuit of the measurement coil and the reference coil.

The present invention also provides a deposition apparatus comprising deposition means for depositing a thin film on a surface of a circular substrate and a film-thickness measurement apparatus for measuring a thickness of the thin film on the surface of the substrate. The film-thickness measurement apparatus includes an axis determination apparatus for determining a center axis line of the surface of the circular substrate and a measurement apparatus for measuring the thickness of an electrically conductive thin film formed on the surface of the substrate. The axis determination apparatus includes a support mount for supporting the substrate placed on a surface thereof, a drive mechanism for rotating the support mount in a plane containing the surface of the support mount, a light-emitting device disposed near a circumferential portion of the support mount, and a light-receiving device disposed, opposite to the light-emitting device, near the circumferential portion of the support mount, the light-emitting device being designed to emit a beam of light to the light-receiving device. The measurement apparatus determines a measurement position on the surface of the substrate at the measurement position in accordance with the center axis line determined by the axis determination apparatus and measures the thickness of the electrically conductive thin film at the measurement position.

The present invention further provides an axis determination method for determining a center axis line of a surface of a circular substrate having a notch on part of a circumferential portion of the substrate. The method comprises the steps of determining a center of the surface of the substrate, and irradiating the circumferential portion of the substrate with a beam of light emitted from a light-emitting device. The irradiation is carried out while the substrate is being rotated in a plane containing the surface of the substrate with the center of the surface. At this time, the light-emitting device stays opposite to a light-receiving device to interpose the circumferential portion of the substrate therebetween. The position of the notch is thus detected depending on whether or not the beam of light passes through the notch to be received by the light-receiving device. The method further comprises the step of determining the center axis line of the surface of the substrate in accordance with the position of the notch and the center of the surface.

The present invention further provides a film-thickness measurement method, comprising the step of determining a center of a surface of a circular substrate having a notch formed on part of a circumferential portion of the substrate and having an electrically conductive thin film deposited on the surface. The method further comprises the step of irradiating the circumferential portion of the substrate with a beam of light emitted from a light-emitting device. The irradiation is carried out while the substrate is being rotated in a plane containing the surface of the substrate about the center of the surface. At this time, the light-emitting device stays opposite to a light-receiving device to interpose the circumferential portion of the substrate therebetween. The position of the notch is thus detected depending on whether or not the beam of light passes through the notch to be received by the light-receiving device. The method further comprises the step of determining the center axis line of the surface of the substrate in accordance with the position of the notch and the center of the surface. The method still further comprises the step of determining a measurement position on the surface of the substrate in accordance with the center axis line and measures the thickness of the electrically conductive thin film at the measurement position.

The film-thickness measurement method according to the present invention further comprises the steps of disposing a measurement coil in close proximity to the substrate and applying an AC voltage to the measurement coil to generate an eddy current in the electrically conductive thin film on the surface of the substrate. The method further comprises the step of detecting a signal produced in the measurement coil by an effect of the eddy current to determine the thickness of the electrically conductive thin film in accordance with the signal.

The film-thickness measurement method according to the present invention further comprises the step of preparing a Maxwell's inductance bridge by connecting a serially-connected circuit of two reference resistors in parallel to a serially-connected circuit of a measurement coil and a reference coil. The serially-connected circuit of two reference resistors has two reference resistors connected in series to each other; and the reference coil connected in series to the measurement coil is disposed at a position farther away from the substrate than the measurement coil. The method further comprises the step of using the Maxwell's inductance bridge to determine a variation in inductance component of the measurement coil, and thereby detect a signal produced in the measurement coil.

The axis determination apparatus according to the present invention comprises the support mount, the drive mechanism for rotating the support mount, the light-emitting device disposed near the circumferential portion of the support mount, and the light-receiving device disposed opposite to the light-emitting device to interpose the surface including the surface of the support mount therebetween. With the circular substrate having the notch formed on the circumferential portion thereof being supported on the support mount, the light-receiving device receives the beam of light emitted from the light-emitting device when the notch of said circular substrate stays in between the light-emitting device and the light-receiving device.

With this configuration, rotating the support mount to rotate the substrate allows the light-receiving device to receive the beam of light emitted from the light-emitting device only when the notch formed on the circumferential portion stays in between the light-emitting device and the light-receiving device. This makes it possible to detect the position of the notch by means of the light-emitting device and the light-receiving device.

Since the notch is formed on the circumferential portion of the substrate, the position of the center of the substrate is determined in advance, and the position of the center of the substrate is connected to the position of the notch detected, thereby making it possible to determine the center axis line of the substrate surface.

Incidentally, the axis determination apparatus according to the present invention may comprise a lifter having a support member and a projected member provided on the support member. The support member is provided with a gradually inclined surface sloped towards the projected member; and the projected member is adapted to place the circumferential portion of the substrate thereon. The axis determination apparatus may be adapted such that the virtual center of the lifter overlaps the center of the support mount upon placing the substrate onto the support mount from the lifer.

When the substrate is placed on the lifter, this configuration allows the substrate to fit into the projected members along the gradually inclined surfaces. The substrate then sits at the predetermined position of the lifter with the circumferential portion of the substrate staying on the projected member, and the substrate is thus supported on the lifter with the center of the substrate in alignment with the virtual center of the lifter.

In this case, the virtual center of the lifter is allowed to overlap the center of the support mount upon placing the substrate onto the support mount from the lifter, thereby causing the center of the substrate to be aligned with the center of the support mount. Accordingly, the lifter makes it possible to know the position of the center of the substrate.

The film-thickness measurement apparatus according to the present invention comprises the axis determination apparatus of the present invention and the measurement apparatus adapted to measure the thickness of an electrically conductive thin film formed on a surface of a circular substrate. The measurement apparatus is designed to move over the surface of the substrate in accordance with the center axis line determined by the axis determination apparatus.

With the center axis line of the substrate surface determined by the axis determination apparatus, this configuration makes it possible to employ the center axis line as the coordinate axis to set coordinates on the substrate surface, thereby allowing for knowing predetermined measurement positions on the substrate surface. This makes it possible to determine the thickness of the thin film at a plurality of measurement positions, thereby determining the thickness distribution of the thin film.

Incidentally, the film-thickness measurement apparatus according to the present invention may comprise the measurement apparatus including the film-thickness sensor, the power source, and a measurement device. The film-thickness sensor comprises the measurement coil. The power source is adapted to apply an AC voltage to the measurement coil when the substrate is in close proximity to the measurement coil to generate an eddy current in the electrically conductive thin film on the substrate surface. The measurement device may be adapted to measure a signal produced by an effect of the eddy current in the measurement coil.

In the measurement apparatus configured as described above, the measurement coil provided in the film-thickness sensor is arranged in close proximity to the substrate. In this arrangement, an AC voltage is applied to the measurement coil to generate an eddy current in the substrate to determine a signal, produced in the measurement coil by an effect of the eddy current generated in the substrate (such as, the amount of variation in inductance component). This makes it possible to determine the thickness of the thin film deposited on the substrate surface.

The amount of variation in inductance component of the measurement coil is determined by means of a highly sensitive measurement circuit using an inductance bridge.

FIG. 5 is an explanatory block diagram illustrating the principle for measuring inductance components according to the present invention, with a Maxwell's inductance bridge designated by reference numeral 30.

The inductance bridge 30 comprises two serially-connected reference resistors 34, 35, which are connected in parallel to a reference coil 32 and a measurement coil 31 that are connected in series to each other.

With the inductance bridge 30 kept in balance, no voltage appears between output terminals 43 and 44 of the inductance bridge 30 even when an AC voltage $V_D$ is applied to the inductance bridge 30 by an AC voltage source 36 connected between the input terminals 41, 42 of the inductance bridge 30.

With the inductance bridge 30 kept in balance, bringing a substrate 50 close to the measurement coil 31 causes an eddy current to be generated in the substrate 50, resulting in a variation in inductance of the measurement coil 31. This variation drives the inductance bridge 30 out of balance, causing a voltage $V_S$ to appear between the output terminals 43, 44.

Suppose that an AC voltage $V_D$ to be applied to the inductance bridge 30 is expressed as shown below. That is, $$V_D = V_{D0} \cdot \exp(i\omega t).$$

Then, a voltage $V_S$ appearing between the output terminals 43, 44 is given by $$V_S = V_{S0} \cdot \exp(i\omega t + \phi)$$
$$= V_{S0} \cdot \exp(i\omega t) \cdot \cos(\phi) + i \cdot V_{S0} \cdot \exp(i\omega t) \cdot \sin(\phi).$$

A component of the voltage $V_S$ in phase with the input voltage $V_D$ and another component 90 degrees out of phase therewith are measured, and a variation in magnitude of the inner circumference of the measurement coil 31 can be determined in accordance with the ratio of the two components.

The amount of variation in inductance component is indicative of the eddy current loss in the substrate 50. Since the frequency of the AC voltage $V_D$ is known, the thickness of a thin metal film formed on the surface of the substrate 50 can be determined if the specific resistance of the substrate 50 and the thin metal film are known.

FIG. 8 is a graph showing an example of the relationship between the amount of variation in inductance component and the thickness of a thin copper film formed on a substrate surface. The AC signal applied has a frequency of 2 MHz and the AC voltage $V_D$ has a magnitude of several volts.

Since the amount of variation in inductance component of the measurement coil 31 varies depending on the thickness of the thin copper film formed on the surface of the substrate as can be seen from the graph, the relationship between the amount of variation in inductance component and the film thickness is measured in advance. The amount of variation in inductance component is measured in the absence of the substrate or the substrate having no thin film formed thereon brought close to the measurement coil. Subsequently, a thin copper film is formed on the surface of the substrate and the substrate having the film deposited thereon is then brought close to the measurement coil to determine the amount of variation in inductance component of the measurement coil. Consequently, the thickness of the thin film deposited can be determined in accordance with the determined amount of variation in inductance component.

As described above, according to the film-thickness measurement method of the present invention, the measurement coil is brought into close proximity to the substrate to generate an eddy current in the electrically conductive thin film formed on the substrate surface. The thickness of the electrically conductive thin film is then determined in accordance with the amount of variation, caused by this eddy current, in inductance component of the measurement coil. This makes it possible to determine the actual thickness of the film with accuracy. In addition, the determination of the thickness of the thin film by measuring the amount of variation in inductance component makes it possible to determine the film thickness at a predetermined position in a very short time.

Furthermore, the deposition apparatus according to the present invention comprises deposition means and the film-thickness measurement apparatus of the present invention. This makes it possible to measure the thickness of the thin film deposited and thereby determine the film-thickness distribution without taking the substrate out of the deposition apparatus.

The axis determination method according to the present invention allows the center of the substrate to be detected, and then the position of a notch provided on the circumferential portion of the substrate to be then detected. This makes it possible to determine the center axis line of the substrate surface by connecting the position of the notch to the position of the center of the substrate.

According to the film-thickness measurement method of the present invention, the center axis line is determined prior to the measurement of the film thickness. This procedure makes it possible to know the predetermined position on the substrate surface in accordance with the center axis line of the substrate. For example, both end portions of the surface of the substrate or a predetermined point on the surface of the substrate (such as, the position of the center) can be determined in accordance with the center axis line. This makes it possible to determine the thickness of the thin film at the predetermined points.

BRIEF DESCRIPTION OF THE DRAWINGS

These and other objectives and advantages of the present invention will become apparent from the following description with reference to the accompanying drawings, wherein.

DETAILED DESCRIPTION OF THE PREFERRED EMBODIMENTS

Now, the present invention will be explained below with reference to the accompanying drawings in accordance with the embodiments.

Figure 1:
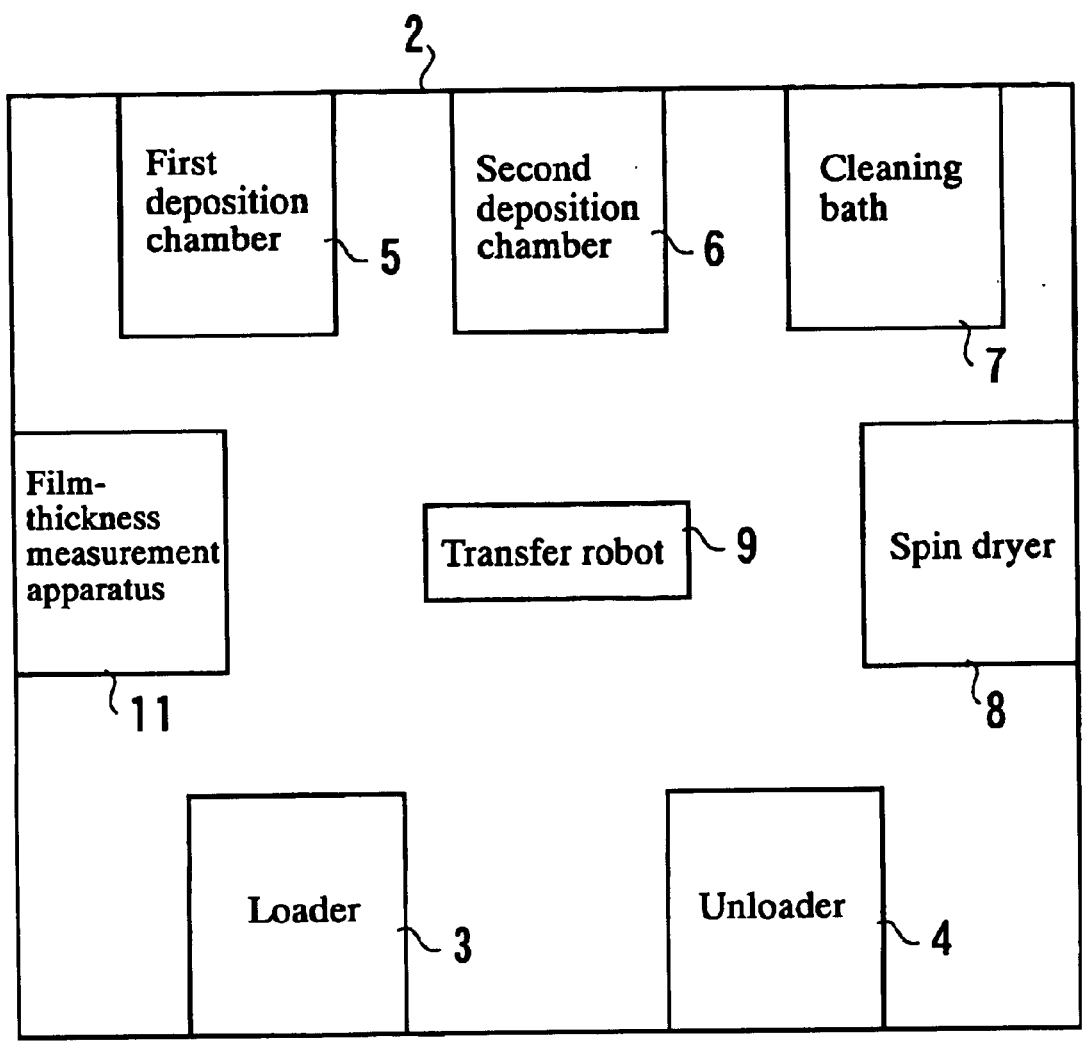
FIG. 1 is a schematic view illustrating a plating deposition system according to an embodiment of the present invention.

FIG. 1 shows a plating deposition system, designated by 1, according to an embodiment of the present invention.

The system has a processing room 2, in which provided are a loader 3, an unloader 4, a transfer robot 9, a first deposition chamber 5, a second deposition chamber 6, a cleaning bath 7, a spin dryer 8, and a film-thickness measurement apparatus 11.

The first and second deposition chambers 5, 6 serve as plating baths each provided with chemicals and electrodes therein, being adapted such that a wafer with a electroconductive seed film on a surface thereof is connected to an electrode and immersed in the chemical, and then a voltage is applied to the electrode in order to grow a thin metal film by electrolysis on the surface of the seed film.

The cleaning bath 7 is provided therein with a cleaning solution and an agitation mechanism, in which the wafer having the film deposited thereon is immersed in the cleaning solution; and then, the cleaning solution is stirred, thereby making it possible to clean the wafer. The spin dryer 8 has a spin table (not shown) and is adapted to rotate a cleaned wafer supported on the spin table, thereby spinning the remaining cleaning solution out of the wafer surface to dry the wafer.

The transfer robot 9 has a robot hand (not shown), which is moved, with a wafer held thereon, to transfer the substrate among the loader 3, the unloader 4, the first deposition chamber 5, the second deposition chamber 6, the cleaning bath 7, the spin dryer 8, and the film-thickness measurement apparatus 11.

Figure 2:
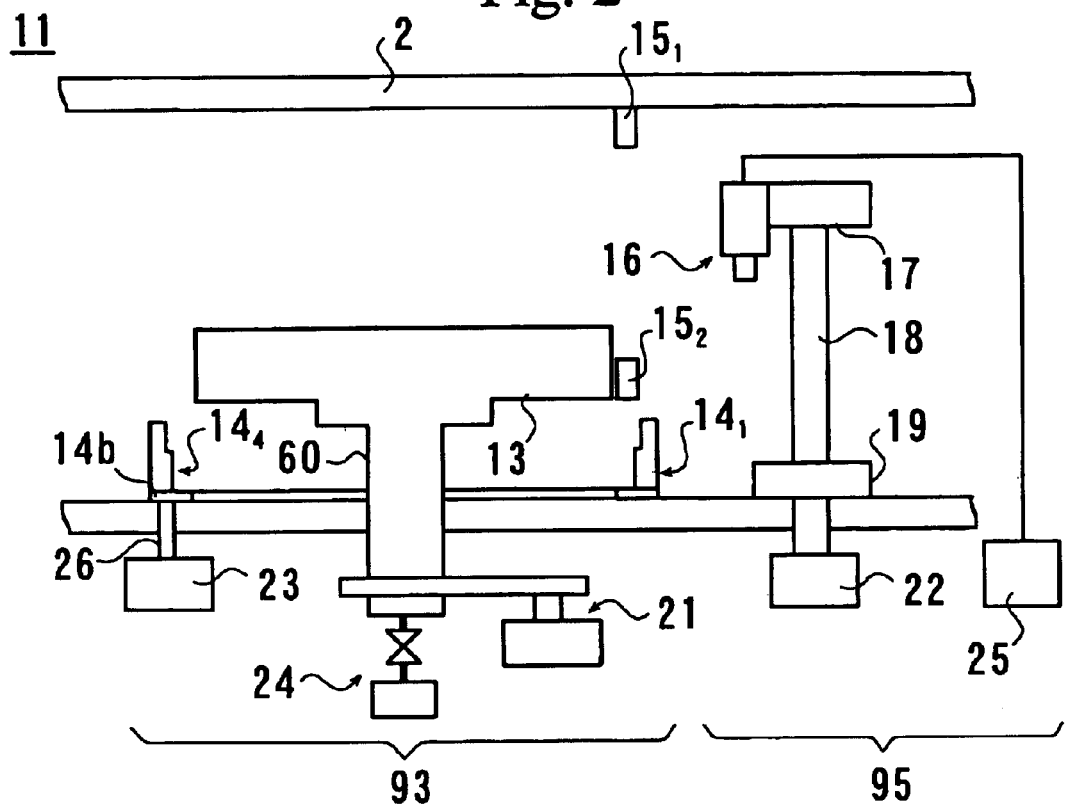
FIG. 2 is an explanatory cross sectional view illustrating the configuration of a film-thickness measurement apparatus according to an embodiment of the present invention.
Figure 3:
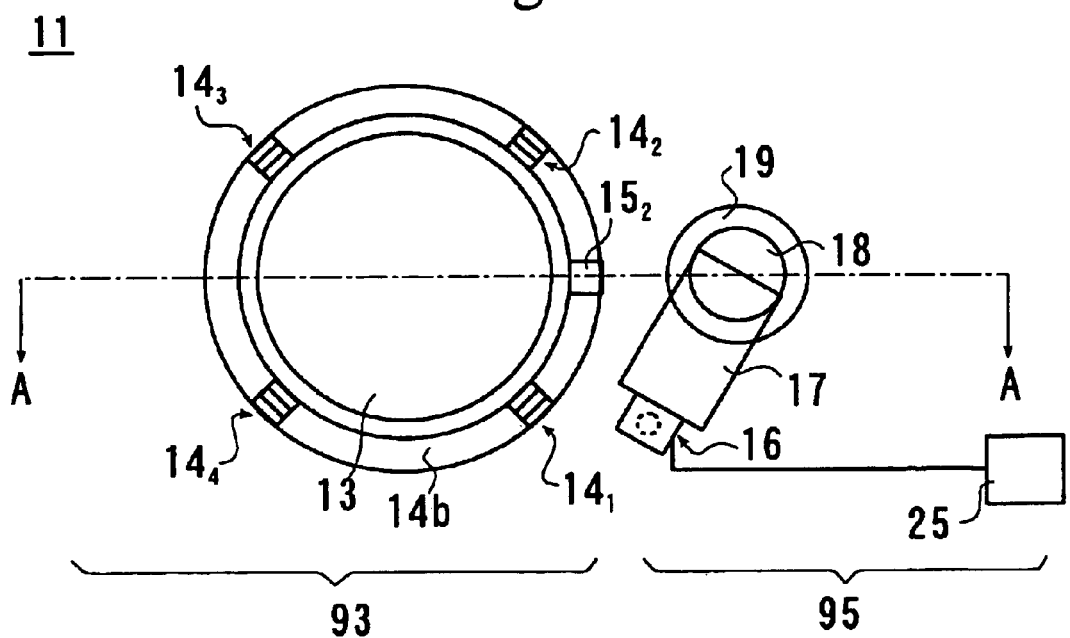
FIG. 3 is an explanatory plan view illustrating the configuration of a film-thickness measurement apparatus according to an embodiment of the present invention.

The configuration of the film-thickness measurement apparatus 11 is shown in FIGS. 2 and 3. FIG. 2 is a conceptual view of the apparatus when viewed from line A—A of FIG. 3. The film-thickness measurement apparatus 11 comprises an axis determination portion 93 and a film-thickness measurement portion 95.

The axis determination portion 93 comprises a support mount 13, a rotation shaft 60, a rotation mechanism 21, a vacuum pump 24, a lifting mechanism 23, a lifter 14, a ring plate 14$b$, a lifting axle 26, a light-emitting device $15_1$, and a light-receiving device $15_2$.

On the bottom surface inside the processing room 2, there are provided holes, spaced from each other, which the rotation shaft 60 and the lifting axle 26 vertically penetrate, respectively. Outside the processing room 2, the rotation mechanism 21 and the lifting mechanism 23 are provided to be connected to the lower ends of the rotation shaft 60 and the lifting axle 26, respectively.

On the upper end portion of the rotation shaft 60, the disc-shaped support mount 13 is provided horizontally.

The support mount 13 is disposed in a manner such that the center thereof is aligned with the center axis line of the aforementioned rotation shaft 60, being such that driving the rotation mechanism 21 will cause the rotation shaft 60 to rotate and the support mount 13 to rotate in a horizontal plane with the center of the support mount 13.

On the upper end portion of the aforementioned lifting axle 26, the ring plate 14$b$ is provided. As shown in the plan view of FIG. 9($a$), the ring plate 14$b$ is disposed on the lifting axle 26 in a manner such that the center thereof is aligned with the center 90 of the support mount 13. In addition, since the inner circumference 14$d$ of the ring plate 14$b$ is greater than the support mount 13 in diameter, there exists a gap 13$b$ between the edge 13$a$ of the support mount 13 and the inner circumference 14$d$ of the ring plate 14$b$. Accordingly, actuating the lifting mechanism 23 will allow the ring plate 14$b$ to move up and down vertically outside the vicinity of the support mount 13 without colliding with the support mount 13. On the upper end portion of the ring plate 14$b$, there are arranged lifters $14_1$–$14_4$.

Figure 9A:
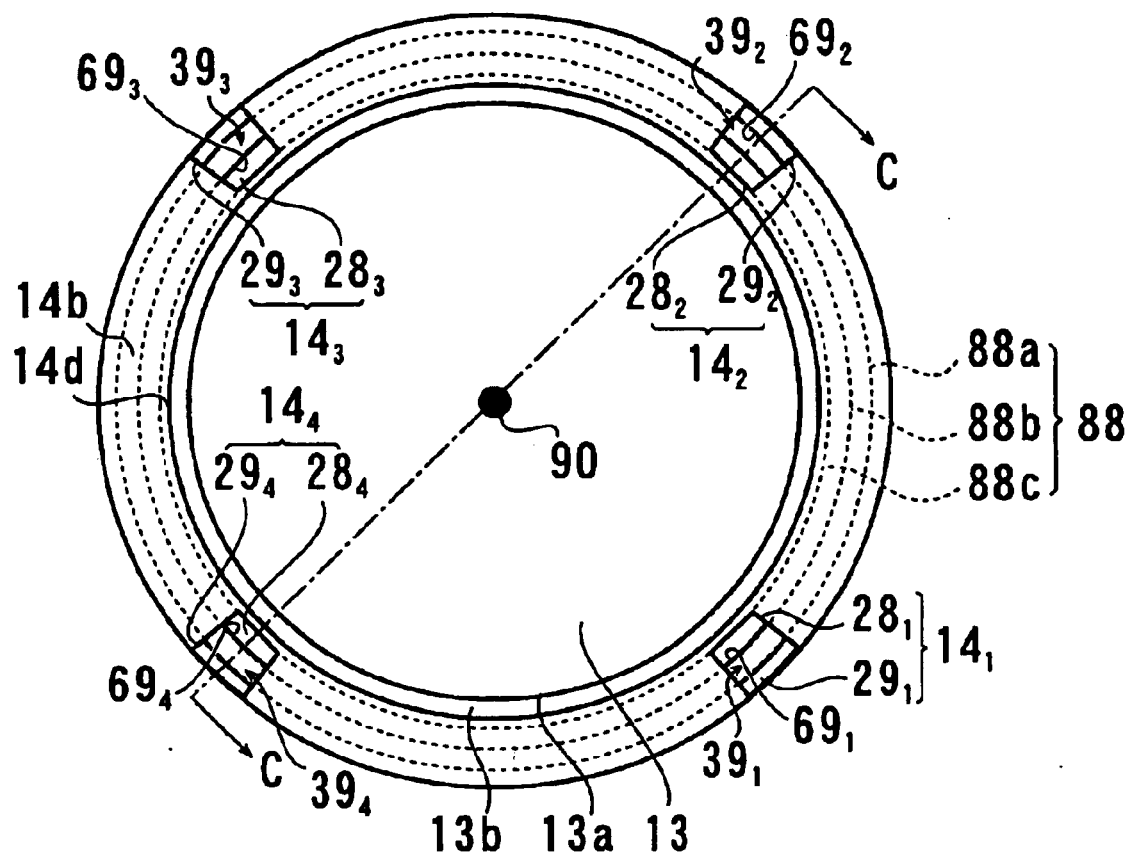
FIG. 9($a$) is an explanatory plan view illustrating the configuration of a lifter according to an embodiment of the present invention, and FIG. 9($b$) is an explanatory cross-sectional view illustrating the configuration of the lifter according to the embodiment of the present invention.
Figure 9B:
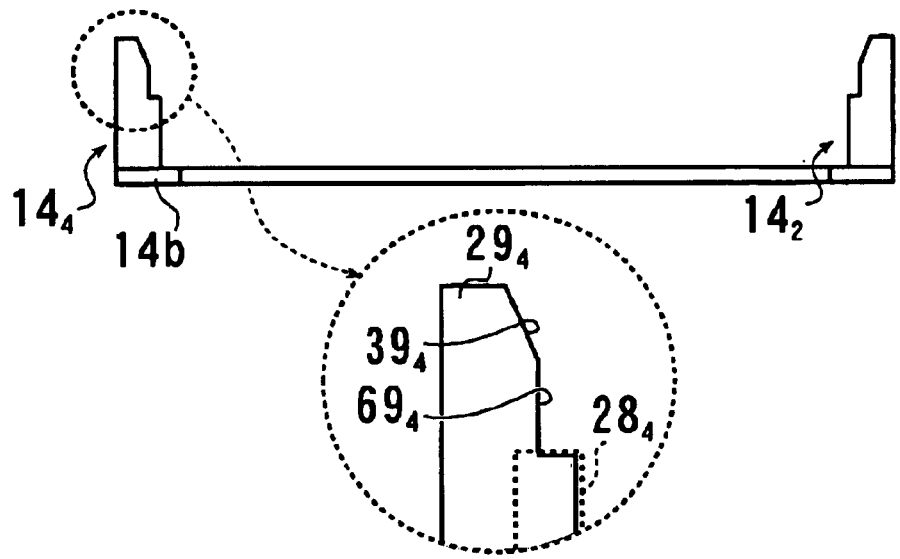

The structure of the lifters $14_1$–$14_4$ is detailed in FIGS. 9($a$) and ($b$). FIG. 9($b$) is a cross-sectional view taken along line C—C of FIG. 9($a$). For simplicity, the lifting axle 26 is not illustrated in FIGS. 9($a$) and ($b$).

The lifters $14_1$–$14_4$ comprise support members $29_1$–$29_4$ and projected members $28_1$–$28_4$, respectively.

Each of the support members $29_1$–$29_4$ is almost formed in the shape of a cube, the bottom surface of which is disposed on the circumference of a circle 88 with center at the center 90 of the support mount 13. Since one surface of the cube faces towards the center 90, the surface is hereinafter referred to as an upright surface and designated by reference numerals $69_1$–$69_4$, respectively.

Below each of the upright surfaces $69_1$–$69_4$, the projected members $28_1$–$28_4$ are disposed so as to project toward the center 90 of the support mount 13. Each of the projected members $28_1$–$28_4$ is provided with a horizontal upper surface, while the bottom surface thereof is fixed to the surface of the ring plate 14b in conjunction with the bottom surface of each of the support members $29_1$–$29_4$. Both the support members $29_1$–$29_4$ and the projected members $28_1$–$28_4$ are arranged so as not to dislodge toward the inner circumference of the ring plate 14b. When the lifting mechanism 23 is actuated to move the ring plate 14b up and down, each of the lifters $14_1$–$14_4$ can move up and down near the circumferential portion of the support mount 13 in conjunction with the ring plate 14b without colliding with the support mount 13.

The aforementioned support mount 13 is provided with a flat surface, which is adapted to place a wafer thereon. This surface is provided thereon with a plurality of holes (not shown). These holes connected to the vacuum pump 24 disposed outside the processing room 2, being designed to clamp the wafer by a vacuum against the surface of the support mount 13 when the vacuum pump 24 is turned on with a wafer placed on the surface.

Now, the film-thickness measurement portion 95 comprises a measurement sensor portion 16, an arm 17, a rotation shaft 18, a drive mechanism 22, and a measurement device 25.

On the bottom surface inside the processing room 2, another hole into which the rotation shaft 18 vertically penetrates is provided. The lower end portion of the rotation shaft 18 is connected to the drive mechanism 22 disposed outside the processing room 2. On the other hand, the upper end portion of the rotation shaft 18 is connected with the distal end portion of the arm 17 disposed horizontally. Driving the drive mechanism 22 will cause the rotation shaft 18 to rotate and to thereby rotate the arm 17 in a horizontal direction.

The arm 17 is designed to extend and retract by the drive mechanism 22 in the direction of extension and retraction. Driving the drive mechanism 22 will cause the arm 17 to extend or retract in the direction of extension and retraction of the arm 17. The measurement sensor portion 16 is provided on the tip portion of the arm 17, thereby moving the measurement sensor portion 16 in a horizontal plane. The tip portion of the arm 17 is designed to stay above the support mount 13 when extended, while staying away from above the support mount 13 when retracted.

Figure 5:
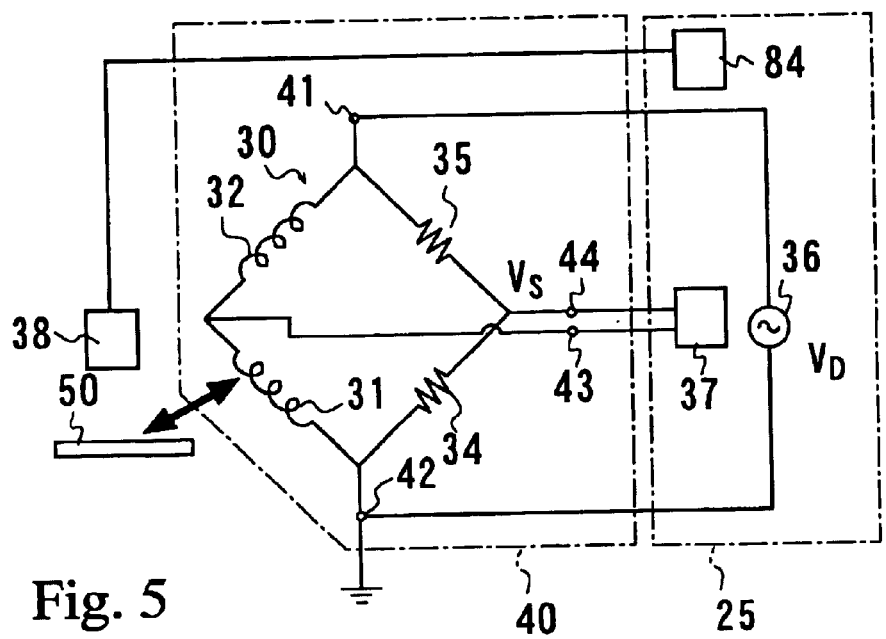
FIG. 5 is an explanatory view illustrating a film-thickness measurement portion according to an embodiment of the present invention.
Figure 6:
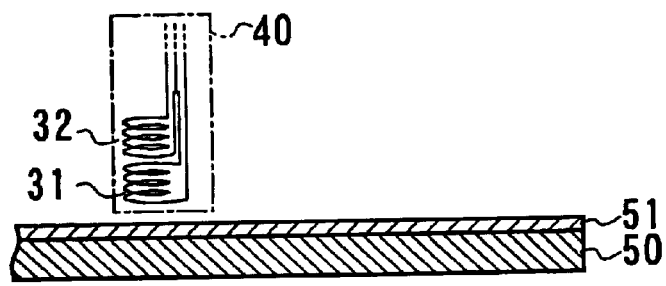
FIG. 6 is an explanatory view illustrating the positional relationship between a measurement coil and a reference coil according to an embodiment of the present invention.
Figure 7:
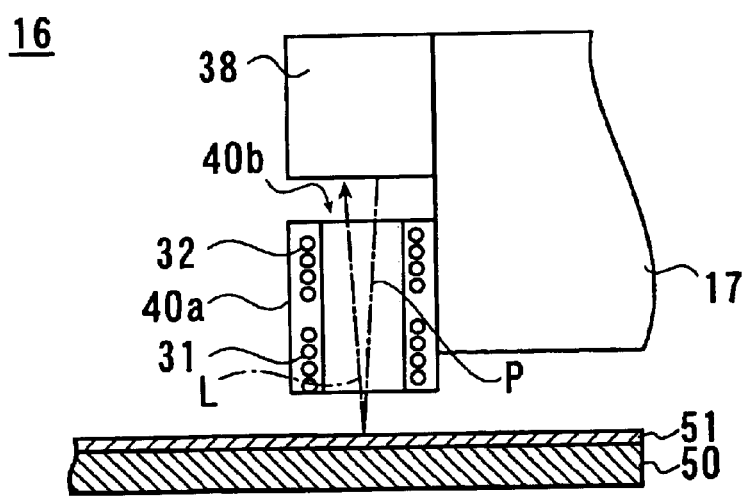
FIG. 7 is an explanatory cross-sectional view illustrating the positional relationship between a film-thickness sensor and a laser sensor according to an embodiment of the present invention.
Figure 8:
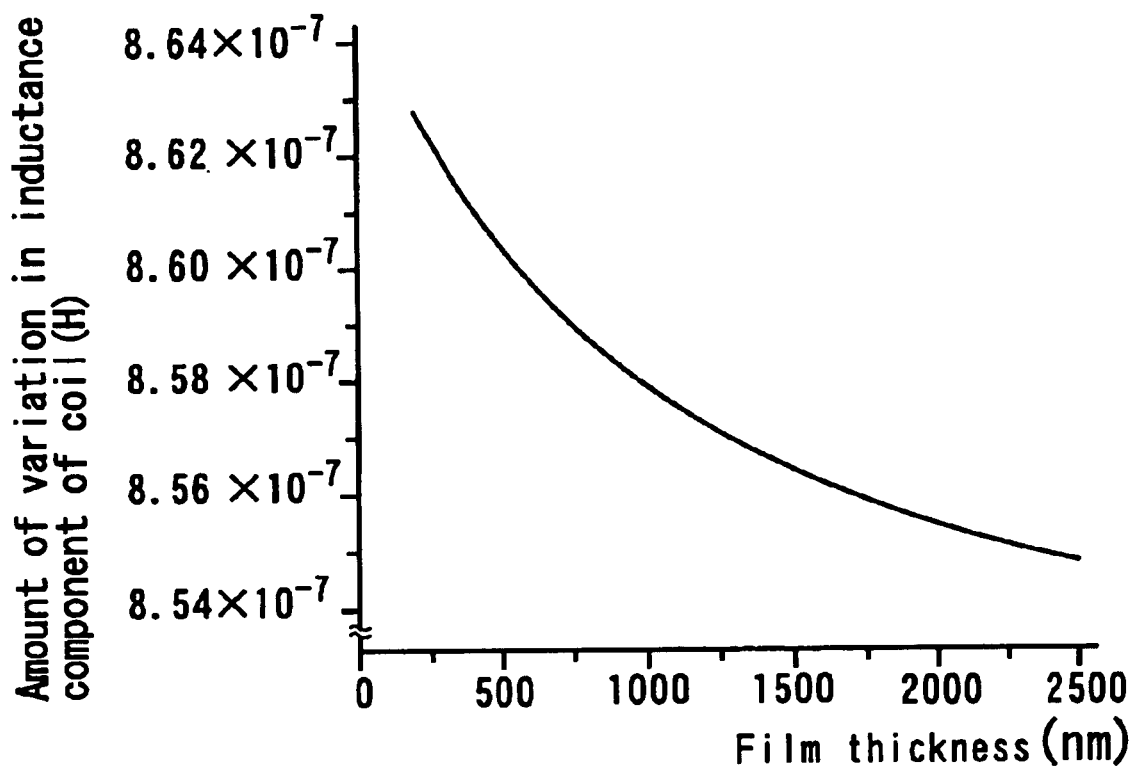
FIG. 8 is a graph showing an example of the relationship between the film thickness and the amount of variation in inductance component.

The configuration of the measurement sensor portion 16 is shown in FIGS. 5 to 7. The measurement sensor portion 16 comprises a housing 40a and a distance sensor 38.

The housing 40a is formed in the shape of a cylinder and attached to the tip portion of the arm 17.

Inside the housing 40a, a film-thickness sensor 40 is provided. As shown in FIG. 5, the film-thickness sensor 40 comprises a measurement coil 31, a reference coil 32, and two reference resistors 34, 35 which are connected in series to each other. As shown in FIG. 7, the measurement coil 31 and the reference coil 32 are disposed at the upper and lower portions, respectively, inside the cylindrical housing 40a about the vertical center axis line of the housing 40a so that the measurement coil 31 stays under the reference coil 32.

The housing 40a is provided with a hollow portion 40b about the vertical center axis line, so that the measurement coil 31 and the reference coil 32 are wound around the hollow portion 40b.

The measurement coil 31 and the reference coil 32 are connected in series to each other, and this serially-connected circuit is also connected in parallel to the serially-connected circuit of the reference resistors 34, 35, thereby forming a Maxwell's inductance bridge 30.

In the inductance bridge 30, both ends of the serially-connected reference resistors 34, 35 serve as input terminals. The input terminals, designated by reference numerals 41 and 42, are shown in FIG. 5. In addition, the connection between the measurement coil 31 and the reference coil 32, and the connection between the two reference resistors 34, 35 serve as output terminals of the inductance bridge 30. The output terminals, designated by reference numerals 43 and 44, are shown in FIG. 5. The inductance bridge 30 is connected to the measurement device 25, as described later.

On the other hand, the distance sensor 38 comprises a laser-beam emitting portion and a light-receiving portion (not shown). As shown in FIG. 7, the distance sensor 38 is attached to the tip portion of the arm 17 so as to stay above the film-thickness sensor 40, being disposed such that the laser-beam emitting portion and the light-receiving portion are located above the hollow portion 40b of the aforementioned housing 40a. As shown in FIG. 7, a laser beam P emitted from the laser-beam emitting portion passes through the hollow portion 40b to impinge upon a target of measurement disposed thereunder. Subsequently, a reflected beam L, reflected from the target of measurement, passes through the hollow portion 40b to be received by the light-receiving portion, thereby making it possible to determine the difference in phase between the laser beam P and the reflected beam L and to be then delivered to the measurement device 25.

The measurement device 25 comprises an AC voltage source 36, a film-thickness measurement system 37, and a distance detector 84.

The AC voltage source 36 is connected to the input terminals 41, 42 of the inductance bridge 30 disposed inside the aforementioned film-thickness sensor 40, being adapted to supply an alternating current, when turned on, to the measurement coil 31.

The film-thickness measurement system 37 is connected to the output terminals 43, 44 of the inductance bridge 30, being adapted to determine the amount of variation in inductance component of the measurement coil 31, as described later, by measuring the voltage appearing between the output terminals 43 and 44.

The distance detector 84 is designed to allow for the determination of the distance between the surface of a wafer and the measurement sensor portion 16, as described later, in accordance with the phase difference delivered by the distance sensor 38. The distance determined as such by the distance detector 84 is delivered to the drive mechanism 22. The drive mechanism 22 is designed to move the arm 17 up and down to maintain the measurement sensor portion 16 and the object of measurement at the constant distance therebetween that has been determined by the distance detector 84, thereby allowing the arm 17 to move in the horizontal direction.

Figure 4A:
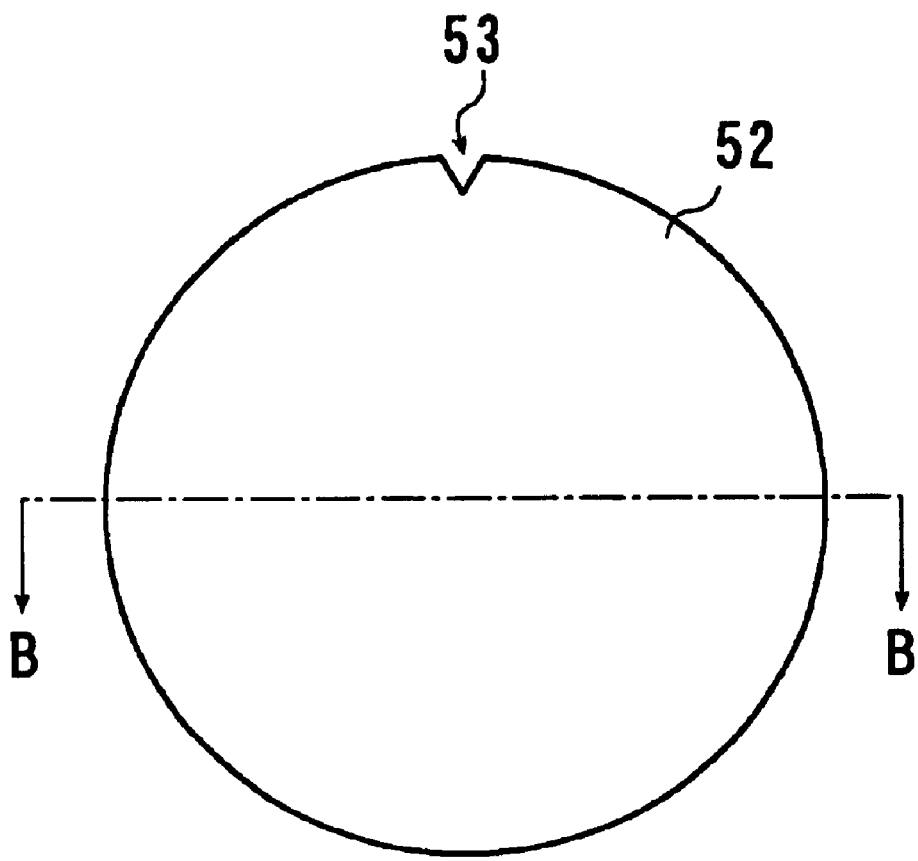
FIG. 4($a$) is an explanatory plan view illustrating a wafer for use with the embodiment of the present invention, and FIG. 4($b$) is an explanatory cross-sectional view illustrating the wafer for use with the embodiment of the present invention.
Figure 11:
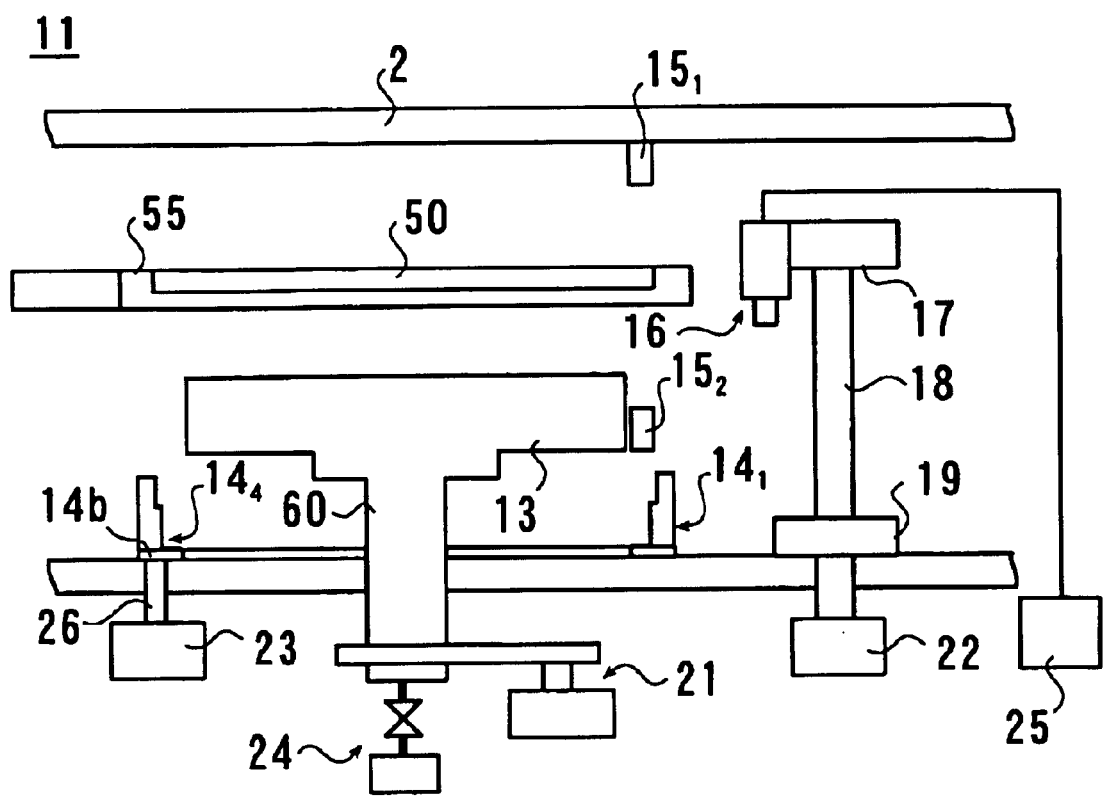
FIG. 11 is a first explanatory view illustrating the operation of a film-thickness measurement apparatus according to an embodiment of the present invention.

When the aforementioned plating deposition system 1 is used to allow only the first deposition chamber 5 to deposit a single-layer thin metal film, a wafer 50 is first loaded into the loader 3, the wafer 50 being formed in the shape of a disc and having a triangular notch 53 provided on the circumferential portion thereof, as shown in FIG. 4(a). The transfer robot 9 is then activated to place the wafer 50 on a hand 55. Subsequently, the hand 55 moves to above the support mount 13. When the hand 55 sits above the support mount 13, the hand 55 comes into a standstill. This state is shown in FIG. 11. At this time, the lifters $14_1$–$14_4$ have been located on the bottom surface inside the processing room 2, and will therefore not collide with the hand 55. In addition, the measurement sensor portion 16 has been retreated from above the support mount 13 to avoid interfering with the hand 55.

The lifters $14_1$–$14_4$ are then lifted to allow the wafer 50 to come closer to the lifters $14_1$–$14_4$.

As shown in FIGS. 9(a) and (b), the aforementioned support members $29_1$–$29_4$ of the lifters $14_1$–$14_4$ are provided with inclined surfaces $39_1$–$39_4$ gradually sloped toward the projected members $28_1$–$28_4$, respectively, each of the inclined surfaces $39_1$–$39_4$ being directed to the center of the support mount 13.

The upper end of each of the inclined surfaces $39_1$–$39_4$ stays on a circle with center at the center 90 of the support mount 13 (the circle being hereinafter referred to as the upper-side circle designated by reference numeral 88a in FIG. 9(a)). On the other hand, the lower end reaches each of the upright surfaces $69_1$–$69_4$ to stay on a circle, smaller than the upper-side circle 88a, with center at the center 90 of the support mount 13 (the circle being hereinafter referred to as the lower-side circle designated by reference numeral 88b in FIG. 9(a)). The upper-side circle 88a is greater than the wafer 50 in diameter.

Figure 10A:
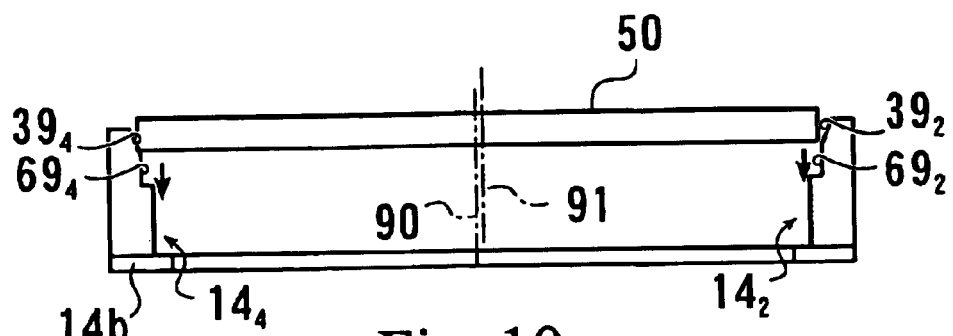
FIG. 10($a$) is an explanatory cross-sectional view illustrating the state of a wafer that is being placed on a lifter according to an embodiment of the present invention, FIG. 10($b$) is a cross-sectional explanatory view illustrating the state of the wafer that has been placed on the lifter according to the embodiment of the present invention, and FIG. 10($c$) is an explanatory plan view illustrating the wafer that has been placed on the lifter according to the embodiment of the present invention.

For this reason, when the center 91 of the wafer 50 is not in alignment with the center 90 of the support mount 13 as shown in FIG. 10(a), lifting the lifters $14_1$–$14_4$ will first cause each of the inclined surfaces $39_1$–$39_4$ of the lifters $14_1$–$14_4$ to come into contact with the lower end portion of the wafer 50.

Figure 10B:
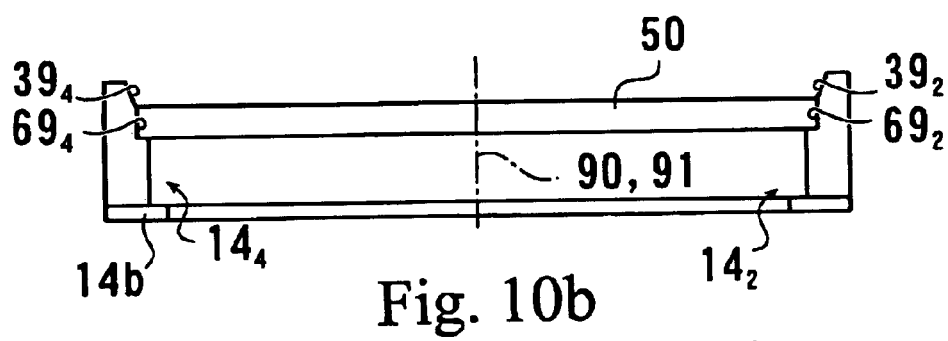

Subsequent lifting of the lifters $14_1$–$14_4$ will cause the lower end portion of the wafer 50 to slide over each of the inclined surfaces $39_1$–$39_4$. With the lower end portion of the wafer 50 completely off the hand 55, the wafer 50 fits in the projected members $28_1$–$28_4$ as shown in FIG. 10(b). The aforementioned lower-side circle 88b is equal to or slightly smaller than the wafer 50 in diameter. For this reason, the wafer 50 fits into the projected members $28_1$–$28_4$ while the side surface of the wafer 50 is in contact with the upright surfaces $69_1$–$69_4$, disposed below the inclined surfaces $39_1$–$39_4$.

Figure 12:
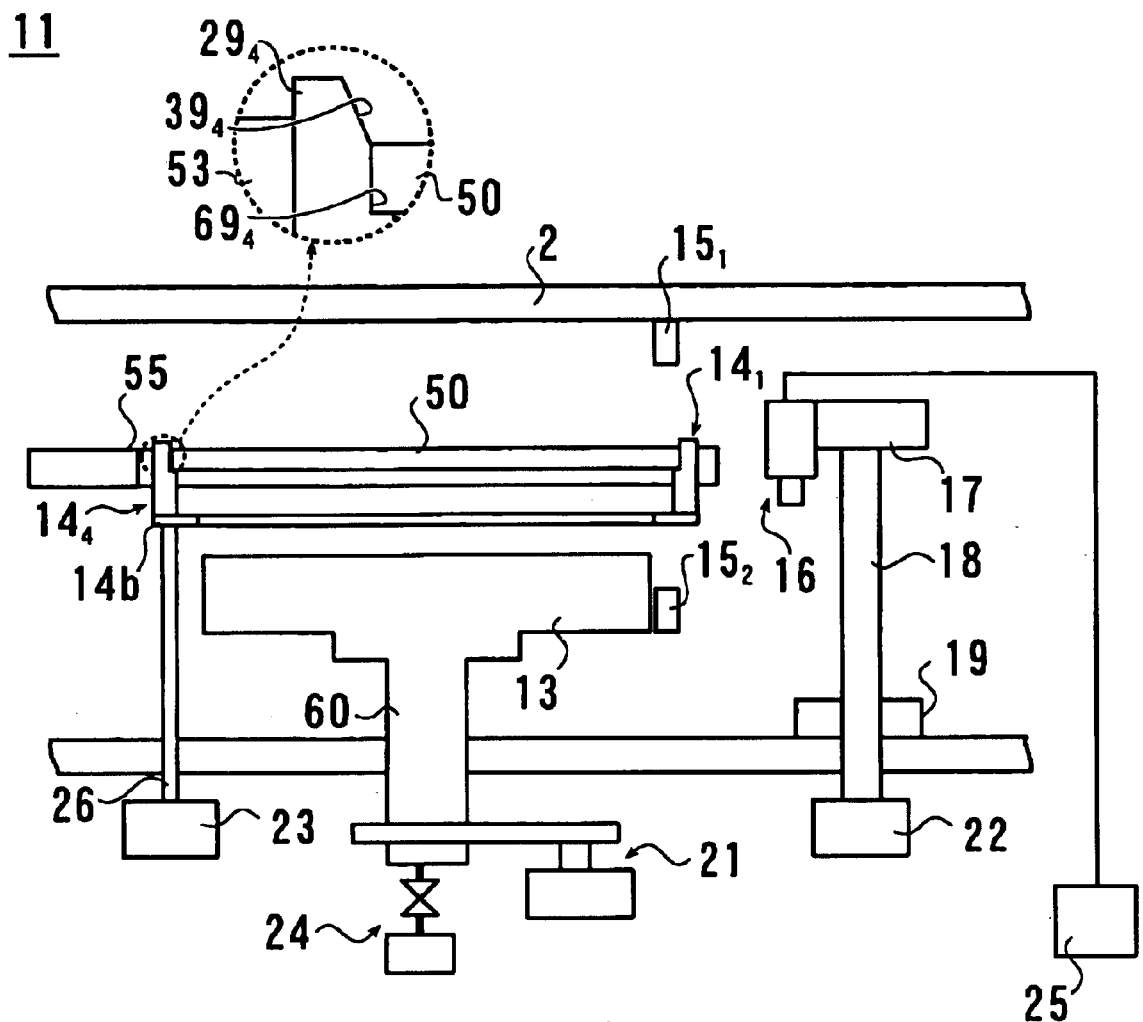
FIG. 12 is a second explanatory view illustrating the operation of the film-thickness measurement apparatus according to the embodiment of the present invention.

The inner circumference of the aforementioned projected members $28_1$–$28_4$ stays on a circle with a center at the center 90 of the support mount 13 (the circle being hereinafter referred to as the projected circle designated by reference numeral 88c in FIG. 9(a)). The projected circle 88c is smaller than the wafer 50 in diameter. This makes it possible to hold the circumferential portion of the wafer 50 with stability and never cause the wafer 50 to be dropped off from the lifters $14_1$–$14_4$ when the wafer 50 is dropped into the projected members $28_1$–$28_4$. FIG. 12 shows this stable state.

Figure 10C:
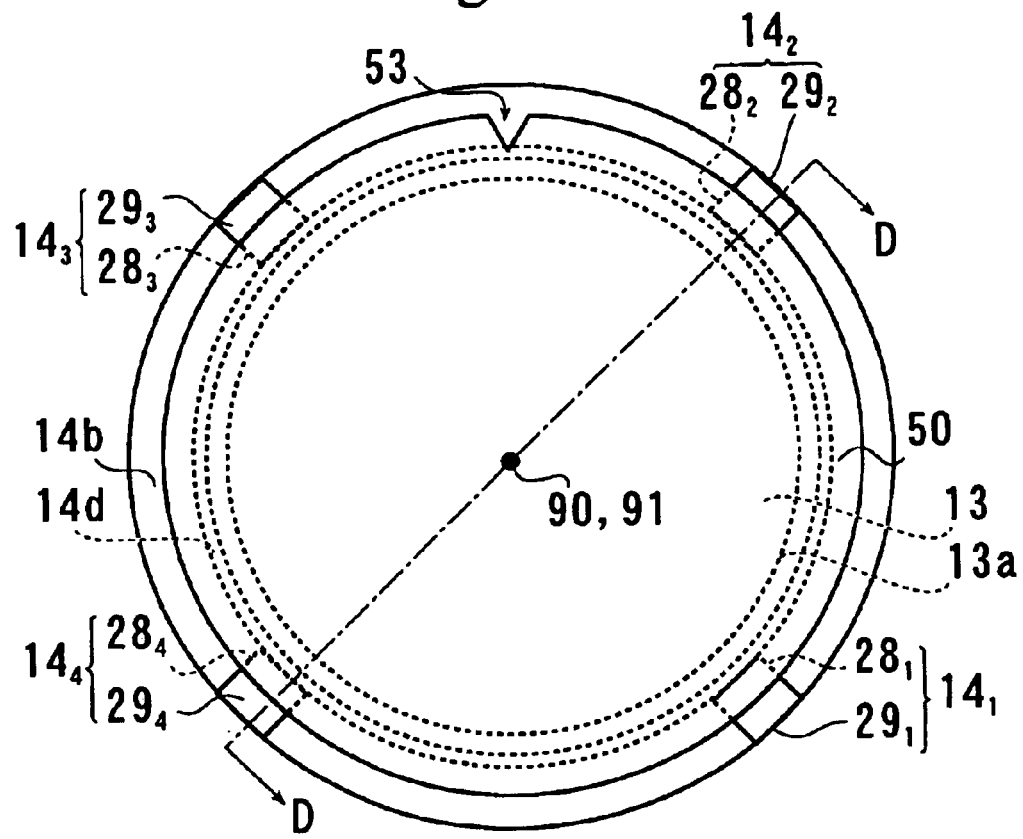

With the wafer 50 fitted in the projected members $28_1$–$28_4$, the side surface of the wafer 50 is in contact with the upright surfaces $69_1$–$69_4$ as shown in FIGS. 10(b) and (c). The upper end of the upright surfaces $69_1$–$69_4$ stays on the lower-side circle 88b, as described in FIG. 9(a), and the lower-side circle 88b is in alignment with the center 90 of the support mount 13. The center 91 of the wafer 50 is therefore in alignment with the center 90 of the support mount 13. Incidentally, FIG. 10(b) is a cross-sectional view taken along line D—D of FIG. 10(c).

Figure 13:
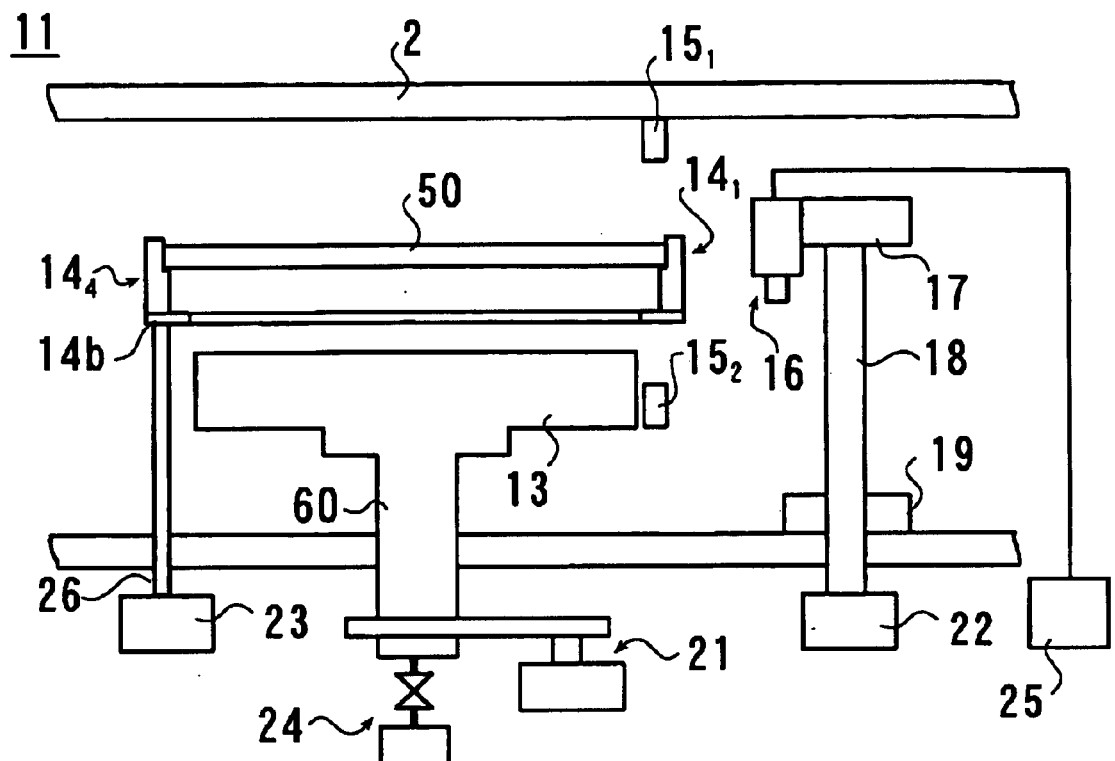
FIG. 13 is a third explanatory view illustrating the operation of the film-thickness measurement apparatus according to the embodiment of the present invention.

Further lifting the lifters $14_1$–$14_4$ for the reverse side of the wafer 50 to be completely off the hand 55 causes the hand 55 to retreat from above the support mount 13 and the wafer 50 to be placed onto the lifters $14_1$–$14_4$. This state is shown in FIG. 13.

Figure 14:
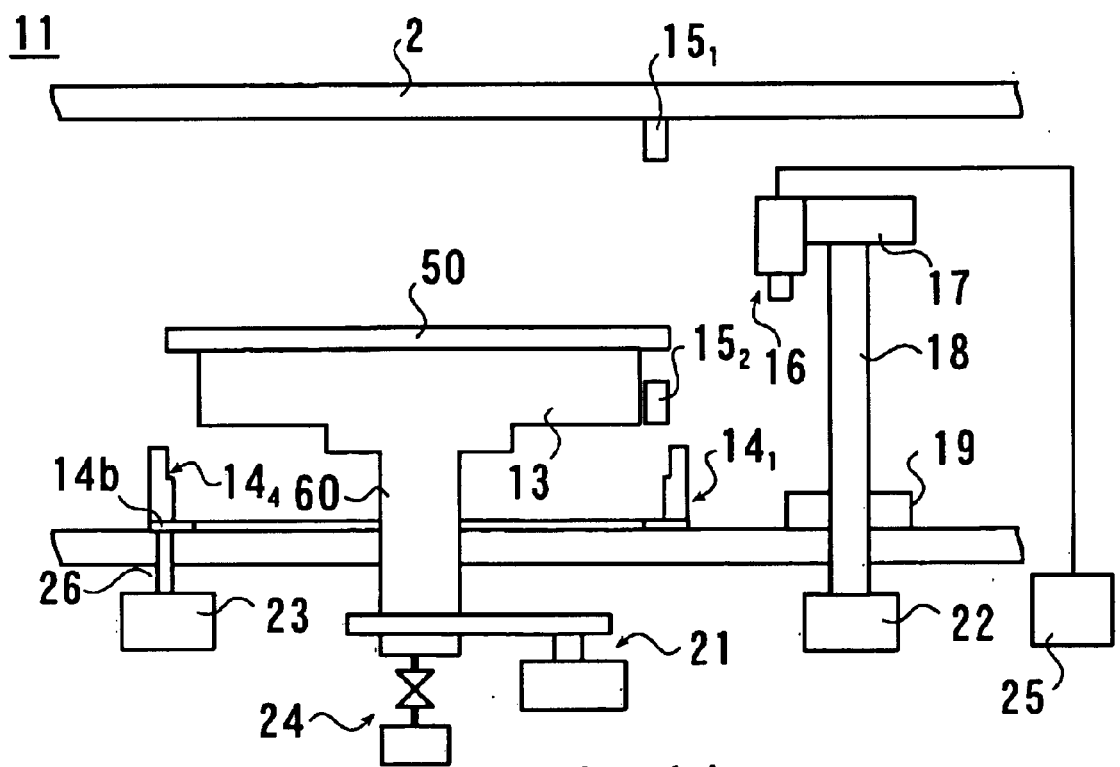
FIG. 14 is a fourth explanatory view illustrating the operation of the film-thickness measurement apparatus according to the embodiment of the present invention.

After the wafer 50 has been completely placed on the lifters $14_1$–$14_4$ as such, the lifters $14_1$–$14_4$ are lowered downwardly in the vertical direction to allow the reverse side of the wafer 50 to come into contact with the surface of the support mount 13. Further lowering of the lifters $14_1$–$14_4$ will cause the wafer 50 to be off the lifters $14_1$–$14_4$ and be placed on the surface of the support mount 13. With the wafer 50 on the support mount 13, the center of the wafer 50 remains in alignment with that of the support mount 13. Thereafter, the lifters $14_1$–$14_4$ are further lowered to reach the inner bottom surface of the processing room 2. This state is shown in FIG. 14.

With the wafer 50 on the surface of the support mount 13, the vacuum pump 24 is operated to clamp the wafer 50 by a vacuum.

The wafer 50 is greater than the support mount 13 in diameter and the circumferential portion thereof lies off that of the support mount 13 by a predetermined distance. The light-emitting device $15_1$, which is adapted to emit a laser beam downwardly in the vertical direction, is provided above the circumferential portion of the wafer 50 that extends off the support mount 13. The light-receiving device $15_2$ is disposed under the light-emitting device $15_1$ at a vertical position to receive the laser beam. A laser beam emitted by the light-emitting device $15_1$ downwardly in the vertical direction impinges upon the circumferential portion of the wafer 50.

Since the center 90 of the support mount 13 is in alignment with the center of the wafer 50, rotating the wafer 50 about the center 90 of the support mount 13 causes the wafer 50 to rotate about its center. The notch 53, which is provided on the outer circumference portion of the wafer 50, is designed to pass the optical path of the laser beam when the wafer 50 is rotated while the light-emitting device $15_1$ emitting the laser beam.

Figure 15:
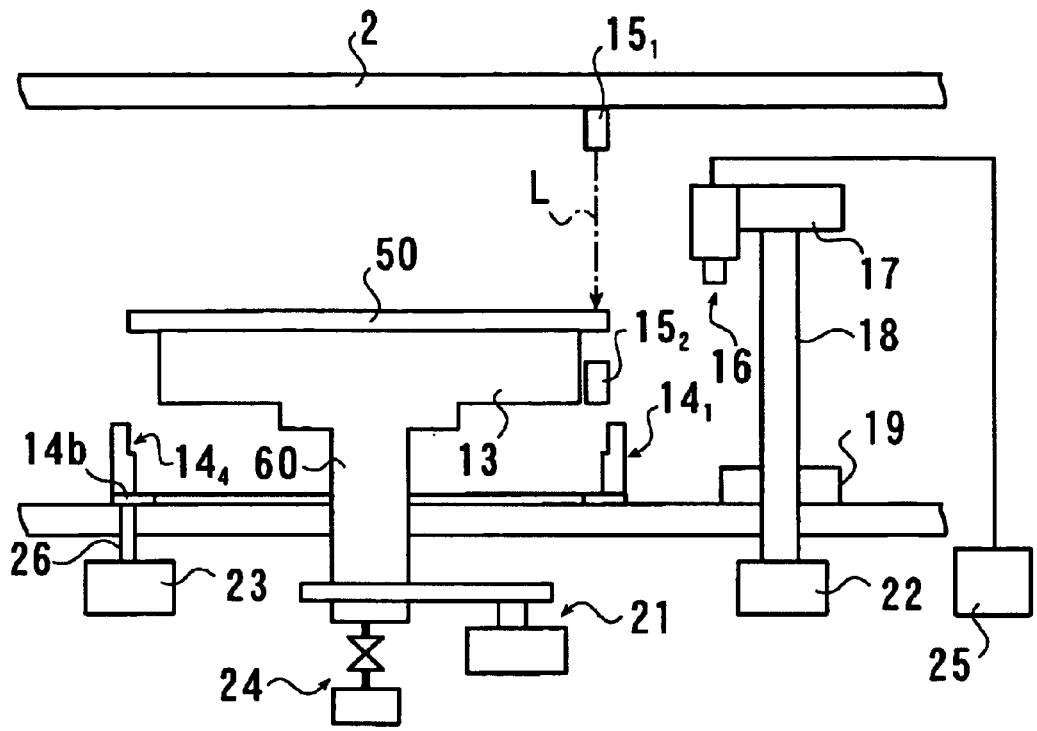
FIG. 15 is a fifth explanatory view illustrating the operation of the film-thickness measurement apparatus according to the embodiment of the present invention.
Figure 25:
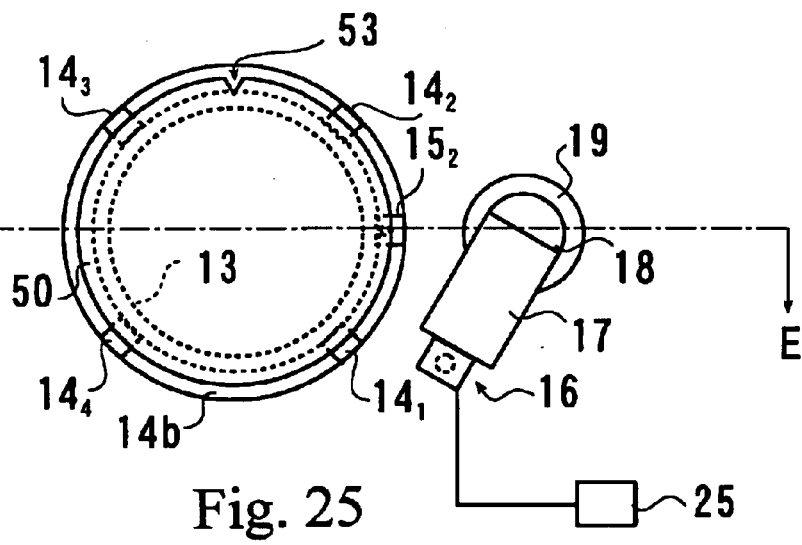
FIG. 25 is a first explanatory plan view illustrating the operation of a film-thickness measurement apparatus according to an embodiment of the present invention.

With the notch 53 out of the path of the laser beam, the circumferential portion of the wafer 50 cuts off the laser beam to cause the laser beam not to reach the light-receiving device $15_2$, thereby making it impossible for the light-receiving device $15_2$ to receive the laser beam. This state is shown in FIG. 15. Incidentally, FIG. 15 is a cross-sectional view taken along line E—E of FIG. 25.

Figure 16:
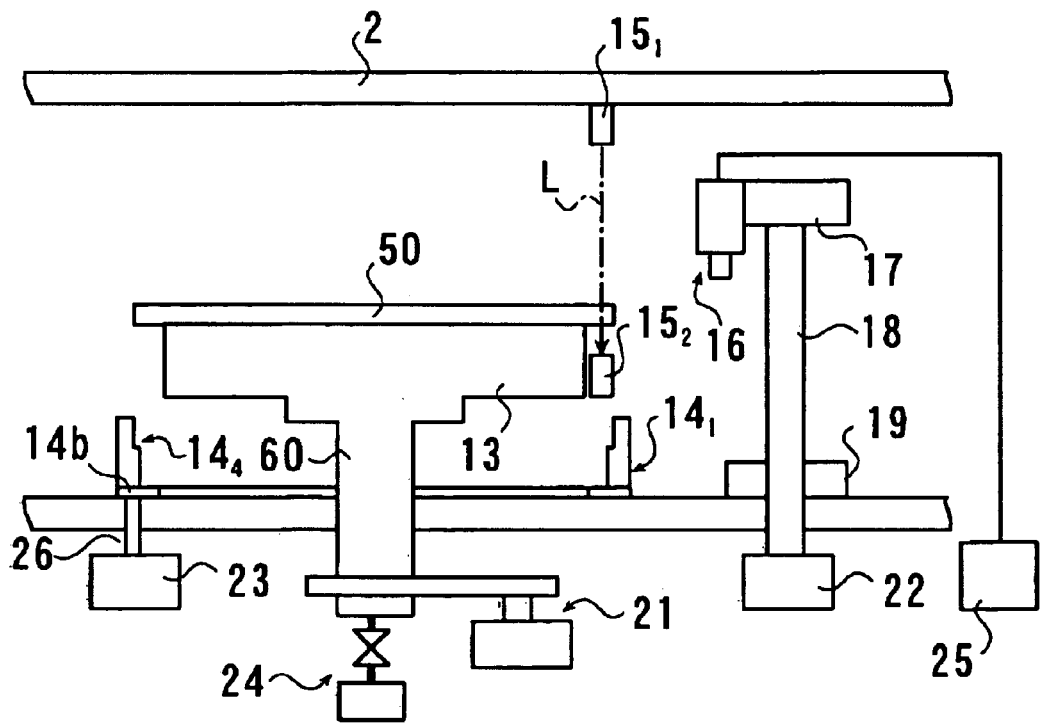
FIG. 16 is a sixth explanatory view illustrating the operation of the film-thickness measurement apparatus according to the embodiment of the present invention.
Figure 26:
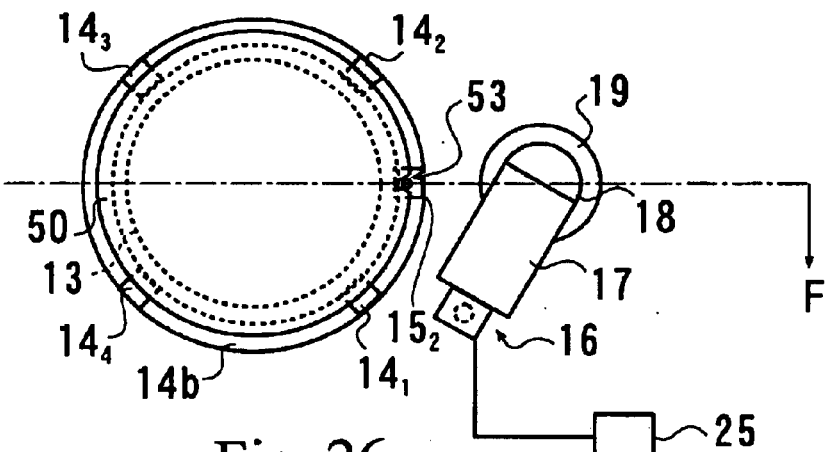
FIG. 26 is a second explanatory plan view illustrating the operation of the film-thickness measurement apparatus according to the embodiment of the present invention.

When the wafer 50 is rotated to cause the notch 53 to come immediately under the light-emitting device $15_1$ in the optical path of the laser beam, the laser beam reaches the light-receiving device $15_2$, disposed under the wafer 50, through the notch 53, thereby making it possible for the light-receiving device $15_2$ to receive the laser beam. This state is shown in FIG. 16. FIG. 16 is a cross-sectional view taken along line F—F of FIG. 26.

When the light-receiving device $15_2$ has received the laser beam, the rotation mechanism 21 stops the rotation of the support mount. In this condition, the wafer 50 is brought into a standstill with the notch 53 sitting between the light-emitting device 151 and the light-receiving device $15_2$.

With the wafer 50 placed on the support mount 13, the center of the wafer 50 is in alignment with the center of rotation of the support mount 13 and the notch 53 is detected which is provided on part of the circumferential portion of the circular wafer 50. Then, a straight line connecting between the notch 53 and the center of the wafer 50 is determined as the center axis line of the surface of the wafer 50. This makes it possible to determine the coordinates of any point on the surface of the wafer 50 in accordance with the center of the wafer 50 and the center axis line of the wafer 50.

The tip portion of the arm 17 moves above the wafer 50 linearly in parallel to the center axis line thereof. The combination of the linear movement and the rotational movement of the support mount 13 makes it possible to move the tip portion of the arm 17 to any point on the surface of the wafer 50. Since the measurement sensor portion 16 is provided on the arm 17 at the tip portion, the measurement sensor portion 16 can be moved to any coordinate point on the surface of the wafer 50. A predetermined position at which the thickness of the electrically conductive film to be measured (hereinafter referred to as a measurement position), described later, is preset and can be converted to the coordinates that are defined by the center and the center axis line. This makes it possible for the measurement sensor portion 16 to move to the measurement position.

Figure 17:
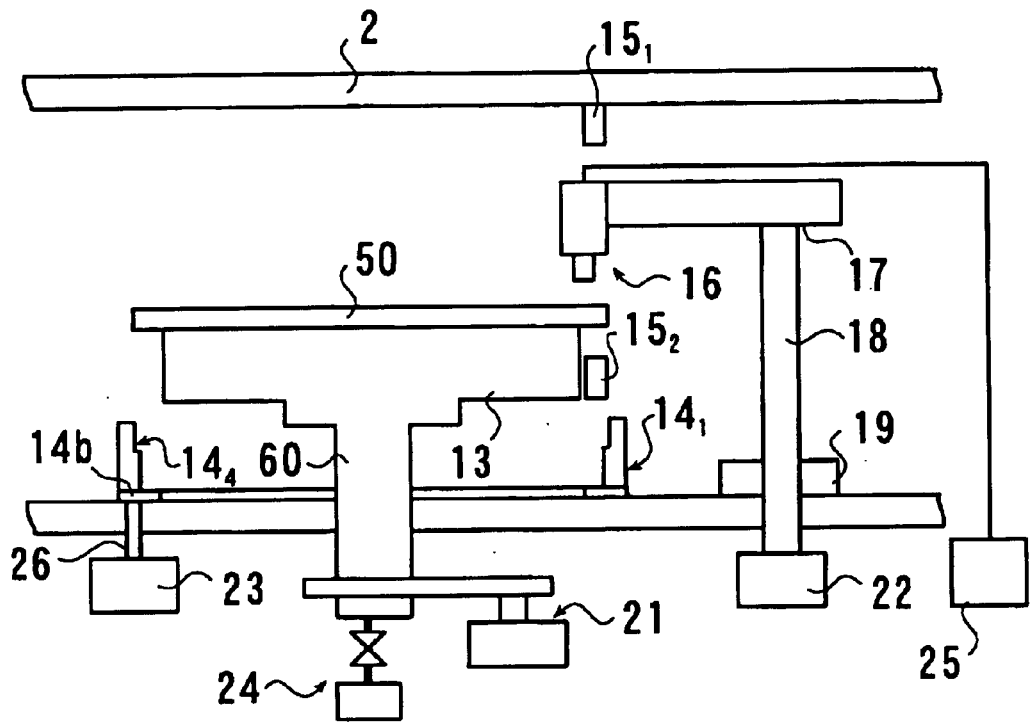
FIG. 17 is a seventh explanatory view illustrating the operation of the film-thickness measurement apparatus according to the embodiment of the present invention.

The drive mechanism 22 then rotates the arm 17 to allow the measurement sensor portion 16 attached to the tip portion thereof to sit above an end portion as one of the measurement positions, of the wafer 50 near the notch 53 as shown in FIG. 17. The distance detector 84 is then used to measure the distance between the measurement sensor portion 16 and the surface of the wafer 50. Then, the arm 17 is moved up and down to bring the measurement sensor portion 16 into a standstill at the predetermined distance between the measurement sensor portion 16 and the surface of the wafer 50.

Subsequently, an AC voltage is applied from the AC voltage source 36 to the measurement coil 31 to measure the initial value of the amount of variation in inductance component of the measurement coil 31 at all measurement positions.

Figure 18:
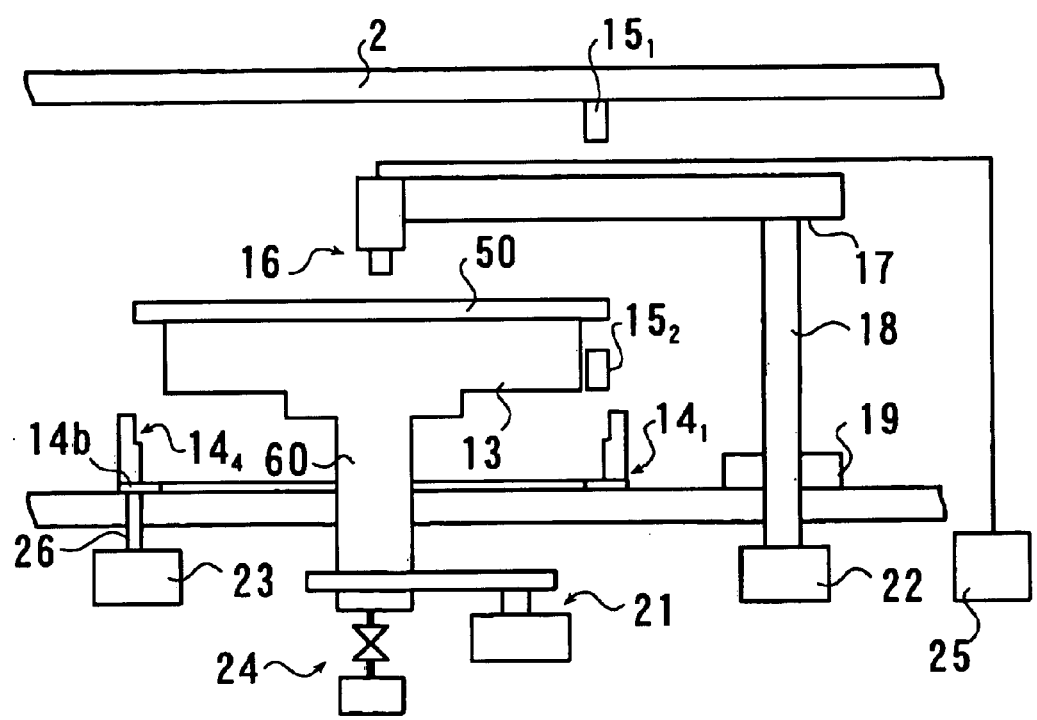
FIG. 18 is an eighth explanatory view illustrating the operation of the film-thickness measurement apparatus according to the embodiment of the present invention.
Figure 19:
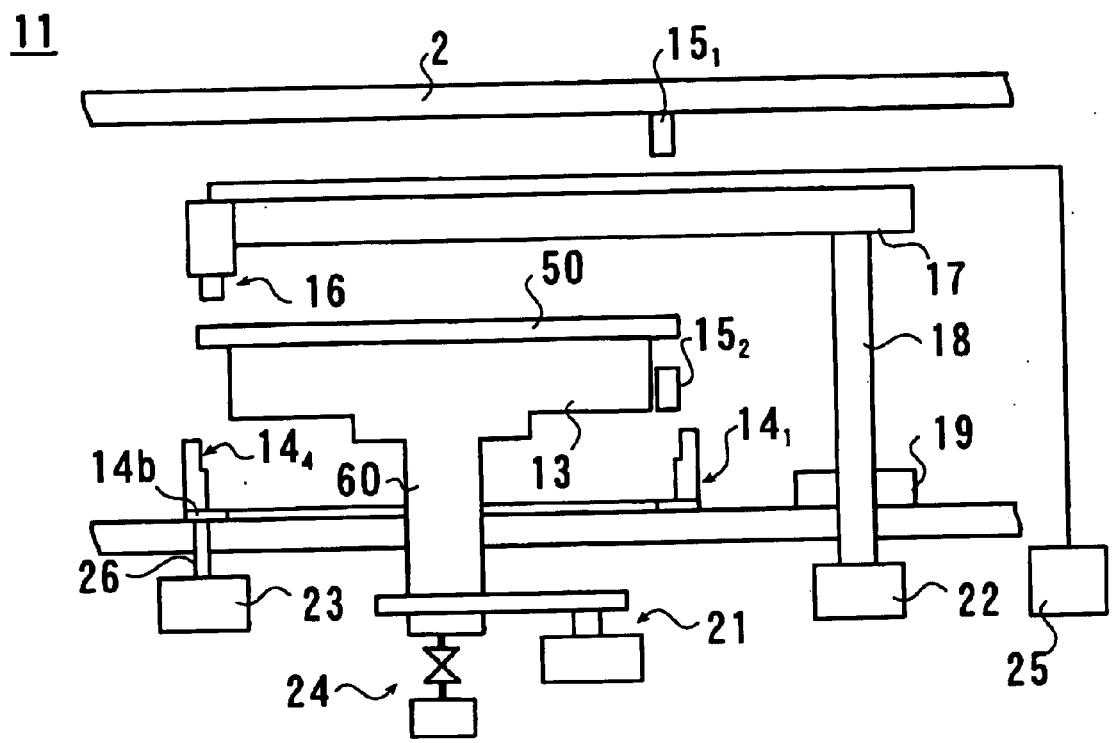
FIG. 19 is a ninth explanatory view illustrating the operation of the film-thickness measurement apparatus according to the embodiment of the present invention.
Figure 27:
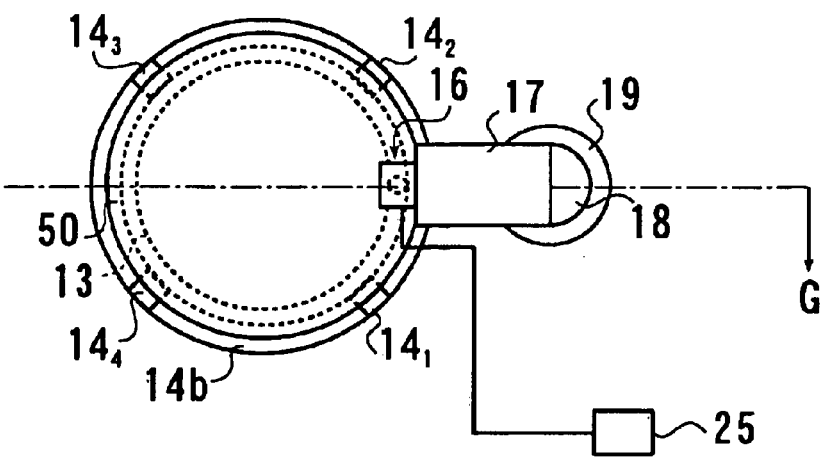
FIG. 27 is a third explanatory plan view illustrating the operation of the film-thickness measurement apparatus according to the embodiment of the present invention.
Figure 28:
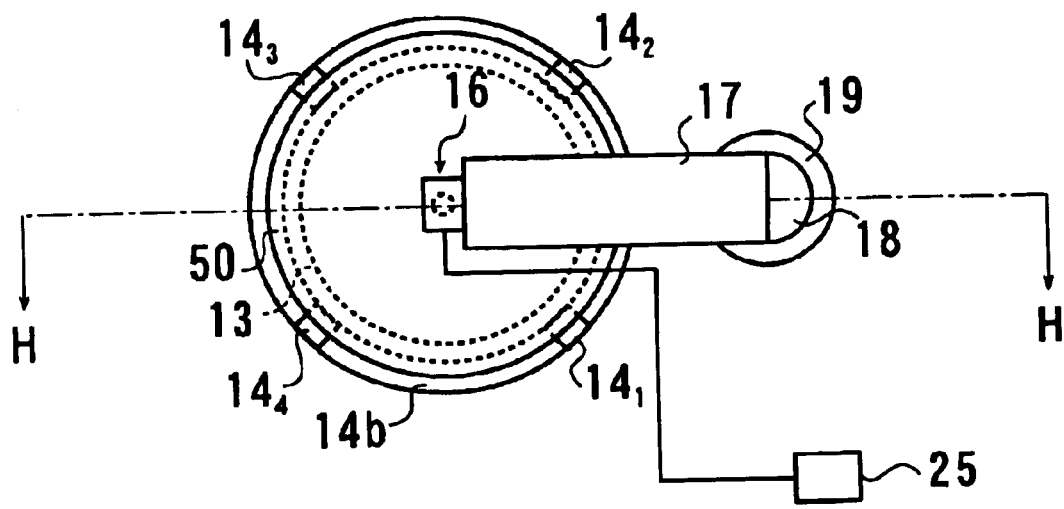
FIG. 28 is a fourth explanatory plan view illustrating the operation of the film-thickness measurement apparatus according to the embodiment of the present invention.
Figure 29:
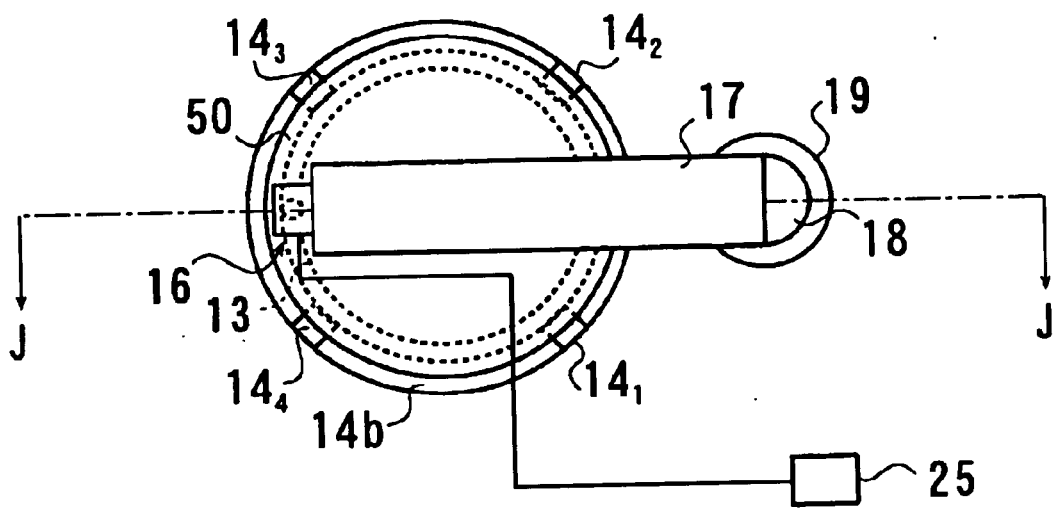
FIG. 29 is a fifth explanatory plan view illustrating the operation of the film-thickness measurement apparatus according to the embodiment of the present invention.

As described above, the initial value of the amount of variation in inductance component at each measurement position is measured with the distance kept constant. FIG. 18 illustrates the state of the measurement sensor portion 16 standing still near the center of the wafer 50. FIG. 19 illustrates the measurement sensor portion 16 standing still at the end portion opposite to the notch 53 with respect to the center axis line. The arm 17 and the wafer 50, which are in the state of FIGS. 17, 18, and 19, and viewed from above, are illustrated in FIGS. 27, 28, and 29, respectively.

As described above, initial values of variation in inductance component at all measurement positions are determined successively and stored corresponding to the position of the wafer 50.

Figure 4B:
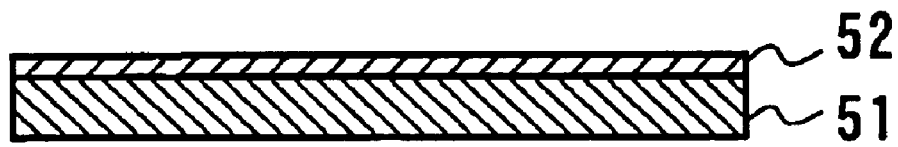

The transfer robot 9 is then used to transfer the wafer 50 to the first deposition chamber 5 in order to deposit a thin metal film by plating on the surface of the wafer 50. FIGS. 4(a) and (b) show the wafer 50 with a thin metal film deposited thereon as described above. FIG. 4(b) is a cross-sectional view taken along line B—B of FIG. 4(a). The wafer 50 has a thin metal film 52 formed on the surface of a circular silicon substrate 51.

After the deposition processing has been completed as described above, the transfer robot 9 transfers the wafer 50 to the cleaning bath 7. The wafer 50 is then cleaned in the cleaning bath 7.

Subsequently, the transfer robot 9 moves the cleaned wafer 50 to the spin dryer 8. The spin dryer 8 dries the cleaned wafer 50. After the wafer 50 has been dried, the wafer 50 is placed onto the hand of the transfer robot 9 with the wafer 50 held horizontally.

Thereafter, the transfer robot 9 moves again the wafer 50 to the film-thickness measurement apparatus 11 to determine the center of the surface of the wafer 50 and the center axis line is detected through the aforementioned procedures. The measurement sensor portion 16 is moved successively to the measurement positions at which the initial values of the amount of variation in inductance component have been measured. With the wafer 50 and the measurement sensor portion 16 kept at a constant distance, the amount of variation in inductance component of the measurement coil 31 is measured at each measurement position.

The amount of variation in inductance component of the measurement coil 31 varies depending on the thickness of the thin metal film 52 deposited on the surface of the wafer 50. The film-thickness measurement system 37 has stored the correspondence between the amount of variation in inductance component and the metal film thickness at each of the aforementioned measurement positions. The difference between the amount of variation in inductance component with the thin metal film 52 deposited and the initial value of the amount of variation in inductance component in the absence of the substrate or with the thin metal film 52 not deposited is determined. This difference is compared with the aforementioned correspondence, thereby making it possible to determine the thickness of the thin film at each measurement position on the surface of the wafer 50 without any contact with the wafer 50.

As described above, the present invention makes it possible to determine easily the distribution of film thickness without complicated manual operations. This method comprises the steps of determining the center axis line of the surface of the wafer 50, determining the prescribed measurement positions on the surface of the wafer 50 in accordance with the center axis line, and measuring the film thickness at each of the measurement positions. Accordingly, this method makes the determination of a film-thickness distribution very easy when compared with the prior-art method in which a stylus is drawn after the predetermined positions of the thin film on the wafer surface has been etched. Furthermore, unlike the prior-art method, the present invention makes it possible to determine the film-thickness distribution without taking the wafer out of the deposition apparatus.

Figure 20:
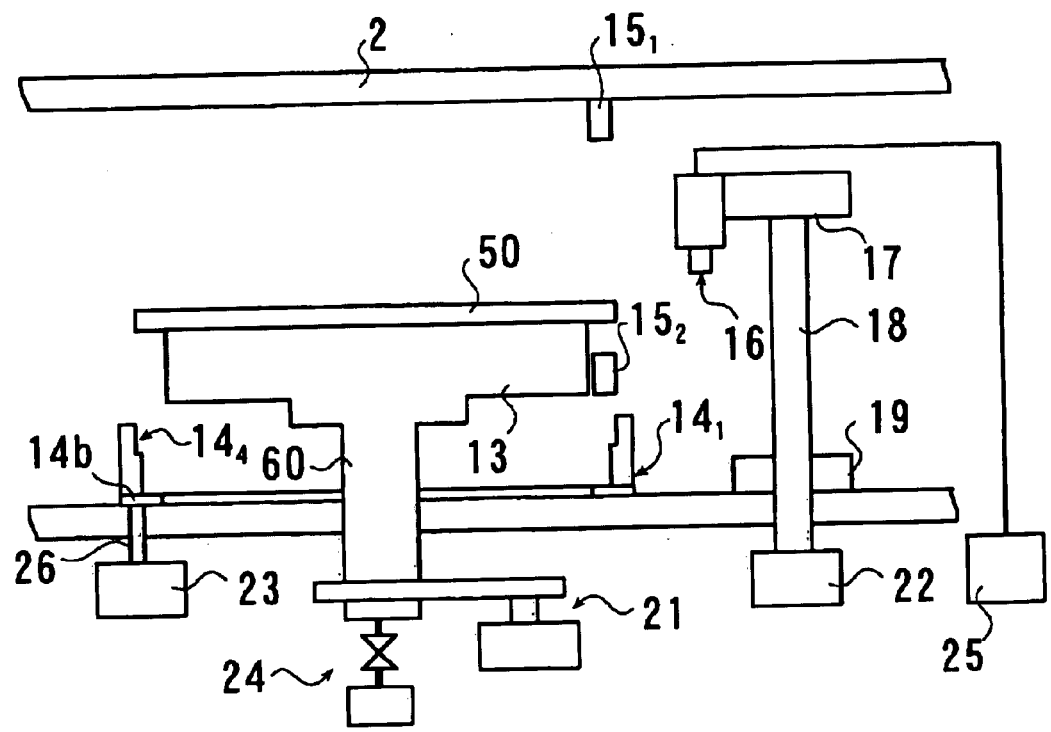
FIG. 20 is a 10th explanatory view illustrating the operation of the film-thickness measurement apparatus according to the embodiment of the present invention.

After the thickness of the thin film has been measured at each measurement position as described above, the arm 17 is rotated again to retreat, and the vacuum pump 24 is stopped to release the clamping of the wafer 50 by a vacuum. This state is shown in FIG. 20.

Figure 21:
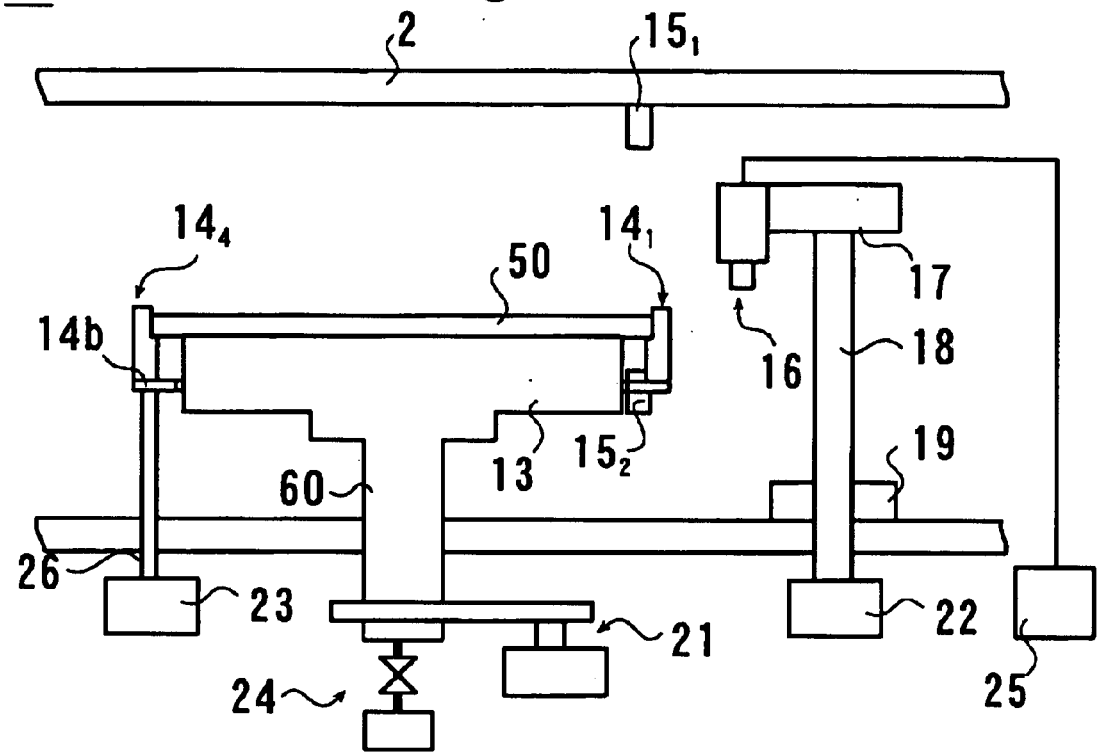
FIG. 21 is an 11th explanatory view illustrating the operation of the film-thickness measurement apparatus according to the embodiment of the present invention.

The lifters $14_1$–$14_4$ then move upwardly. Subsequently, the circumferential portion of the wafer 50 is brought into contact with the lifters $14_1$–$14_4$. This state is shown in FIG. 21.

Figure 22:
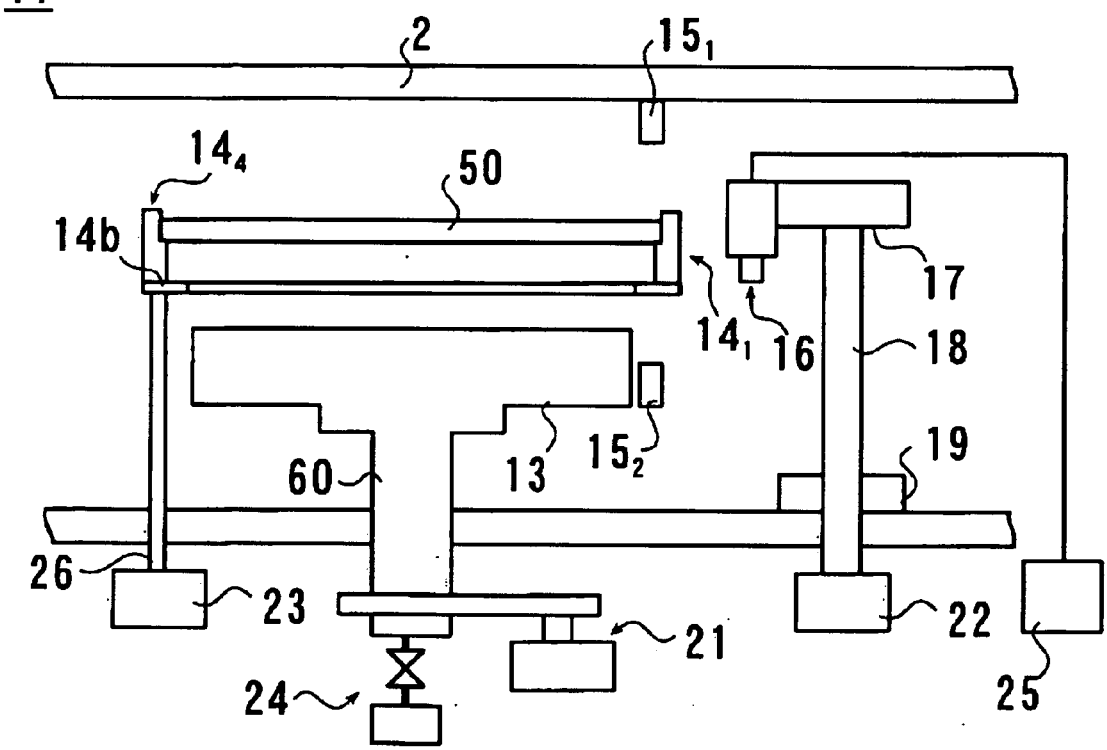
FIG. 22 is a 12th explanatory view illustrating the operation of the film-thickness measurement apparatus according to the embodiment of the present invention.

Further upward movement of the lifters $14_1$–$14_4$ will cause the wafer 50 to be spaced from the surface of the support mount 13 and then transferred onto the lifters $14_1$–$14_4$. Subsequently, the lifters $14_1$–$14_4$ are brought into a standstill at the predetermined position. FIG. 22 shows the lifters $14_1$–$14_4$ at a standstill.

Figure 23:
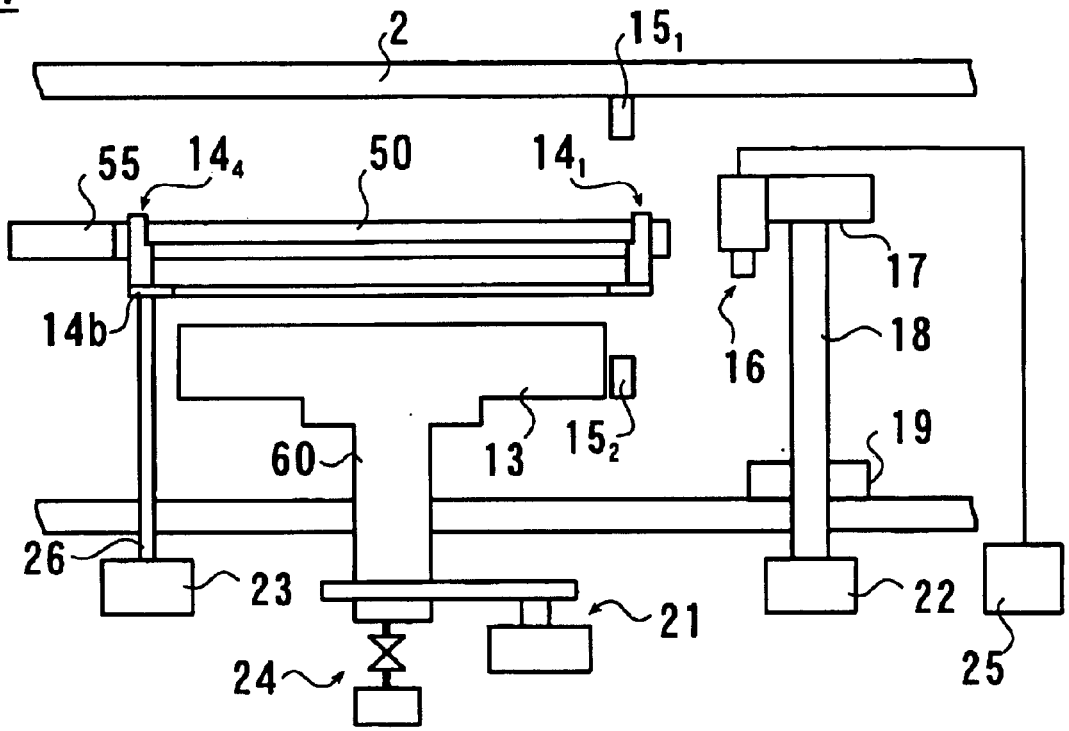
FIG. 23 is a 13th explanatory view illustrating the operation of a film-thickness measurement apparatus according to an embodiment of the present invention.

The hand 55 of the transfer robot 9 then sits below the lifters $14_1$–$14_4$. FIG. 23 shows this state.

Figure 24:
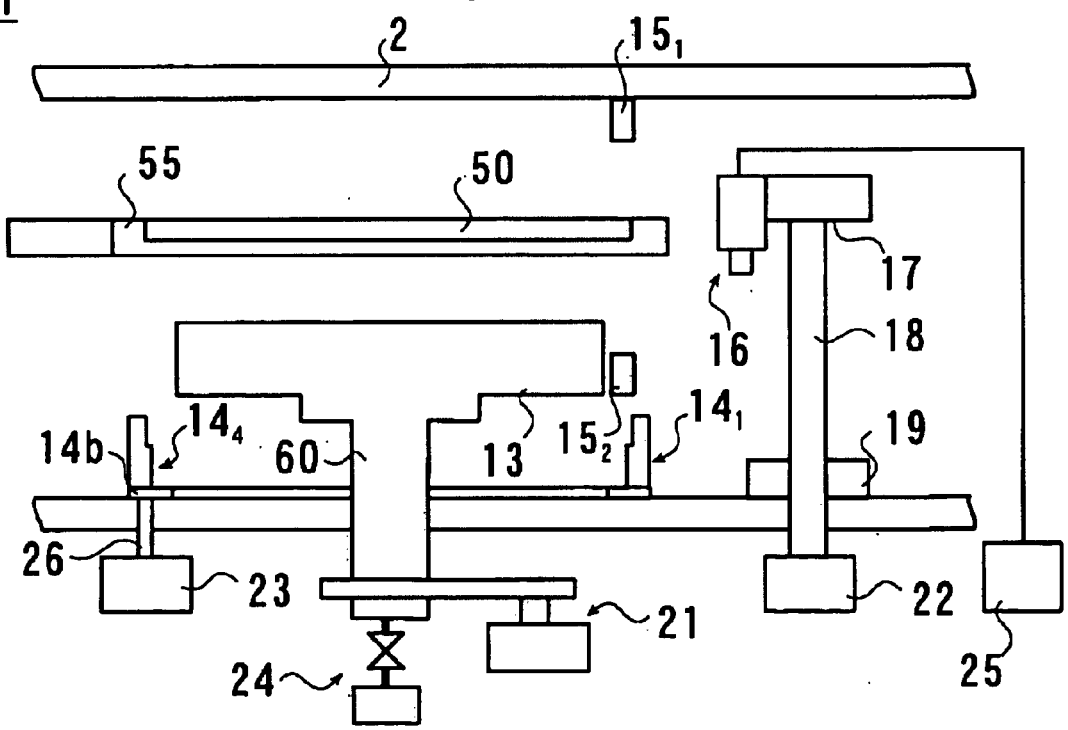
FIG. 24 is a 14th explanatory view illustrating the operation of the film-thickness measurement apparatus according to the embodiment of the present invention.

Subsequent lowering of the lifters $14_1$–$14_4$ causes the wafer 50 to be transferred onto the hand 55 and then spaced from the lifters $14_1$–$14_4$. FIG. 24 shows this state.

Thereafter, the transfer robot 9 again moves the wafer 50 again into the first deposition chamber 5 for the second deposition processing. At this time, the conditions for the second deposition processing in the first deposition chamber 5 are set in accordance with the film thickness and the film-thickness distribution which have been determined after the first deposition processing.

At the second deposition proceeding, the conditions such as for voltage or agitation are set to compensate the variations in film thickness and film-thickness distribution in accordance therewith, thereby making the film thickness uniform on the surface of the wafer 50.

The second deposition processing is thus completed in the first deposition chamber 5. Subsequently, the transfer robot 9 transfers the wafer 50 successively to the cleaning bath 7 and then to the spin dryer 8. After the wafer 50 has been cleaned and dried at the cleaning bath 7 and the spin dryer 8, respectively, the wafer 50 is moved into the film-thickness measurement apparatus 11 to determine the thicknesses of the thin film at a plurality of points on the substrate surface and the film-thickness distribution in the same manner as in the aforementioned procedures.

When the film thickness and the film-thickness distribution are consequently found to be appropriate, the wafer 50 is transferred to the unloader 4 to allow the wafer 50 to be taken out of the unloader 4.

In the foregoing, such a case has been described in which deposition is carried out twice. However, it is also possible to deposit the film up to the predetermined thickness at a time, measure the film-thickness distribution, and re-set the deposition parameters for the subsequent deposition to the conditions for compensating the previous film-thickness distribution, thereby carrying out deposition to always control the film-thickness distribution.

In the foregoing, the film-thickness measurement apparatus of the present invention is provided for the plating deposition system 1 in order to measure the film thickness in an atmospheric environment. However, the film-thickness measurement apparatus of the present invention is not limited thereto and is applicable to, for example, a vacuum processing apparatus.

Figure 30:
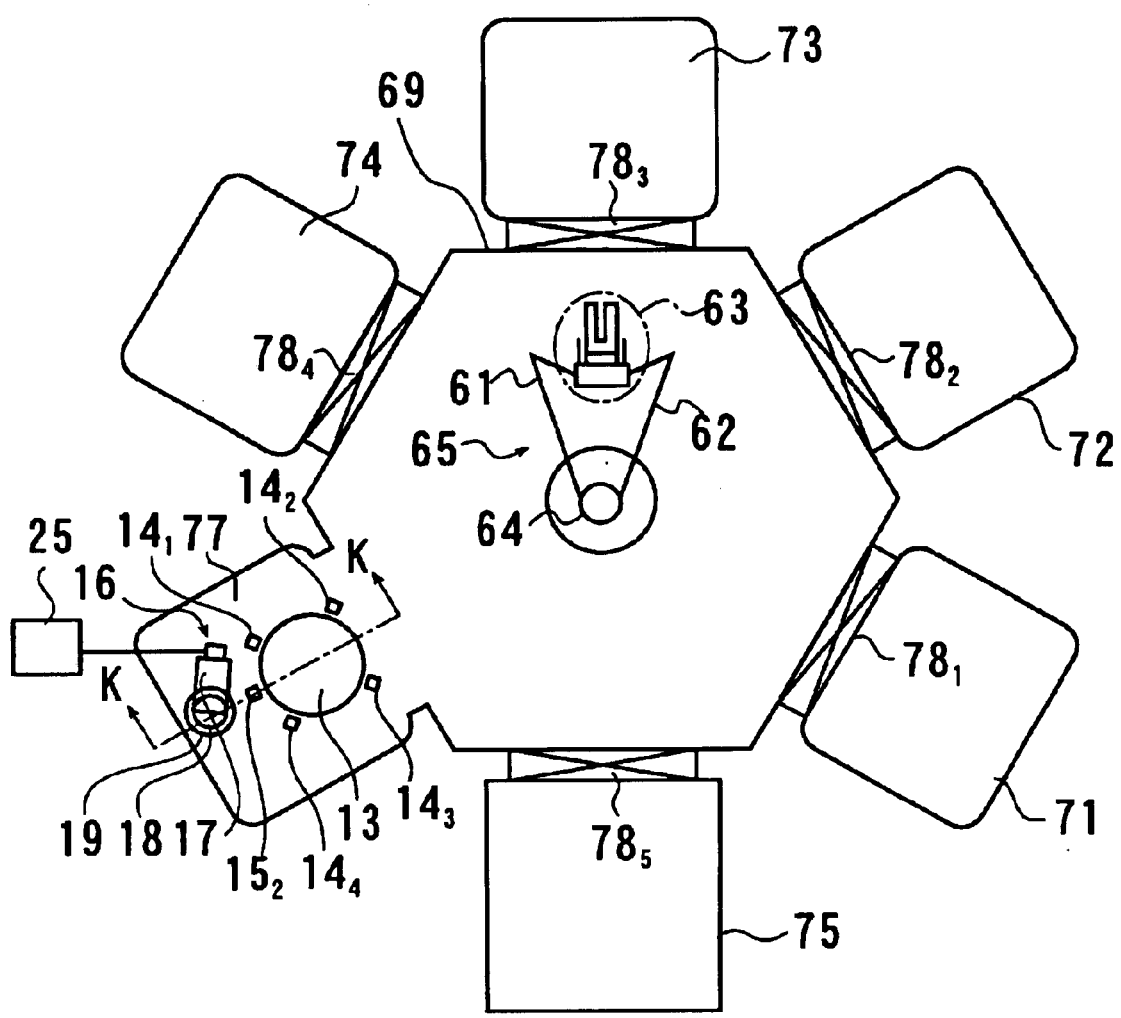
FIG. 30 is an explanatory plan view illustrating a vacuum multi-chamber system according to another embodiment of the present invention.

FIG. 30 shows a vacuum multi-chamber system, generally designated by reference numeral 82, according to another embodiment of the present invention. The multi-chamber system 82 comprises a transfer room 69 having a hexagonal plan view. The transfer chamber 69 is connected with first to fourth processing chambers 71–74 and a loader/unloader chamber 75 via vacuum valves $78_1$–$78_5$, respectively. Each of these chambers is connected with a vacuum evacuation line (not shown) for vacuum evacuation inside each chamber. Closing each of the vacuum valves $78_1$–$78_5$ allows the inside of the first to fourth processing chambers 71-74 and the loader/unloader chamber 75 to be divided from the transfer chamber 69.

A transfer robot 65 is provided in the transfer chamber 69. The transfer robot 65 is operated by means of a drive mechanism (not shown) and mounted to a support 64, which is provided at the center of the transfer chamber 69, extendable vertically, and rotatable horizontally. The transfer robot 65 comprises extendable arms 61, 62 and a hand 63, which is attached to the tip of the arms 61, 62 and formed of an insulating material, being adapted to extend or retract the arms 61, 62 to thereby move the hand 63 at the tip thereof from one chamber to another by rotation of support 64. The hand 63 is designed to place a wafer on the upper surface thereof to transfer the wafer among the chambers 71–75 with the wafer placed on the hand 63.

This multi-chamber system 82 is provided with an extension at a side of the transfer chamber 69, the extension parts serving as a measurement chamber 77. The measurement chamber 77 is integrated with the transfer chamber 69, and no vacuum valve is interposed therebetween.

Figure 31:
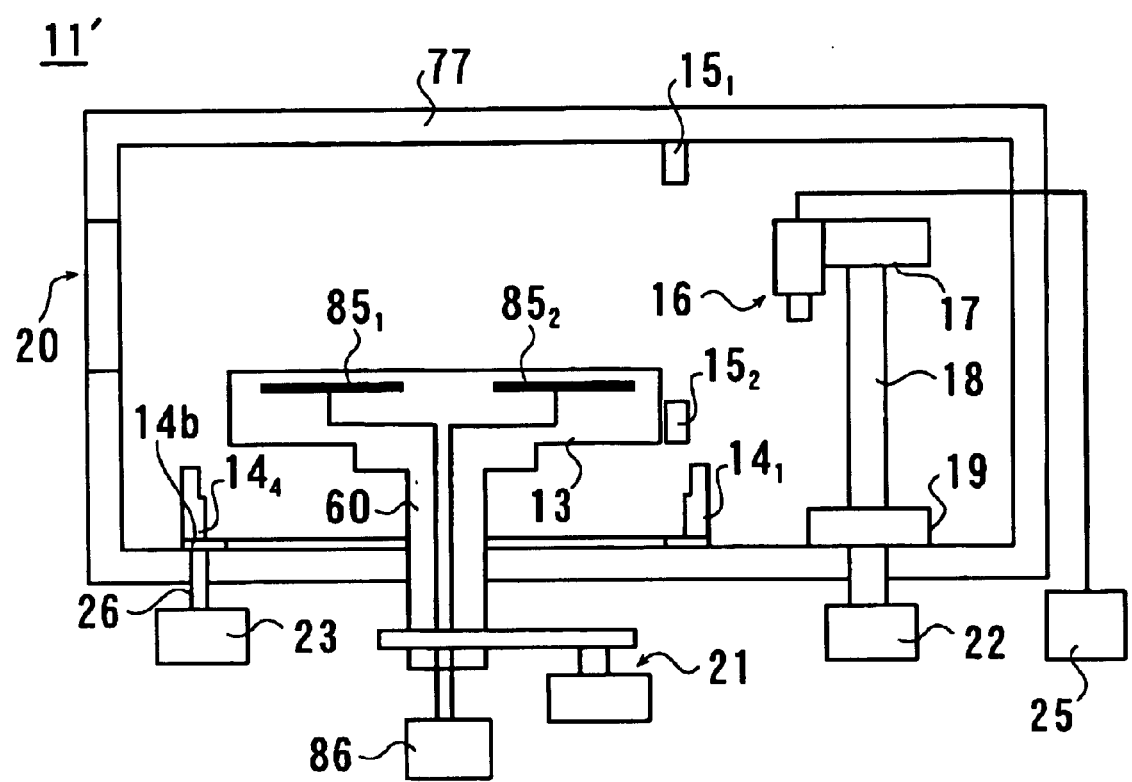
FIG. 31 is an explanatory cross-sectional view illustrating an film-thickness measurement apparatus according to another embodiment of the present invention.
Figure 32A:
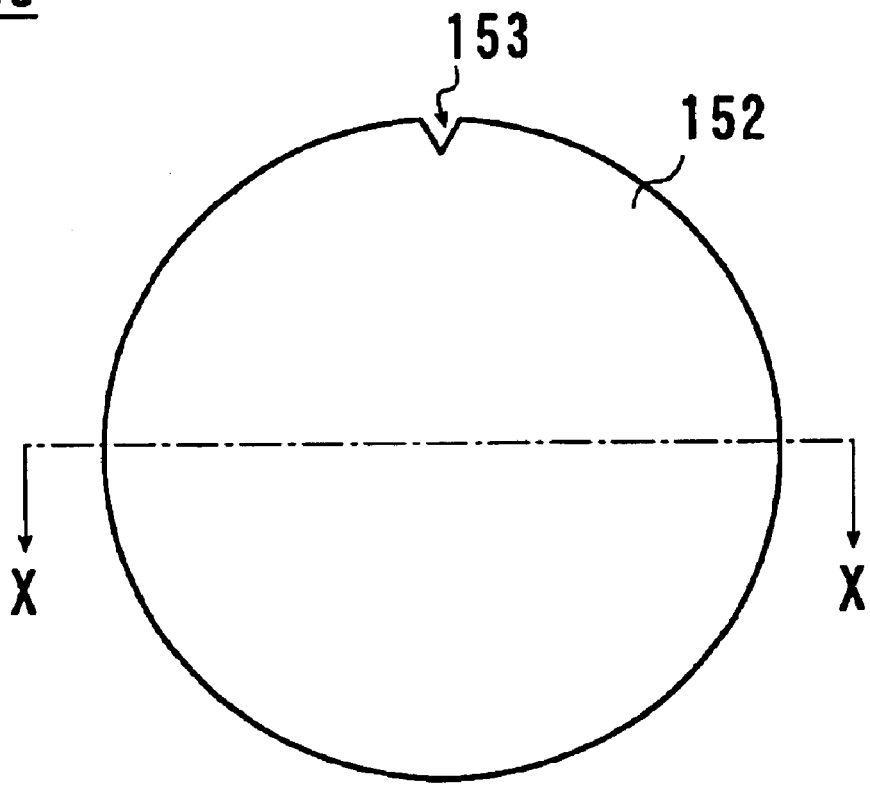
FIG. 32($a$) is an explanatory plan view illustrating a wafer that is conventionally employed, and FIG. 32($b$) is an explanatory cross-sectional view illustrating the wafer that is conventionally employed.
Figure 32B:
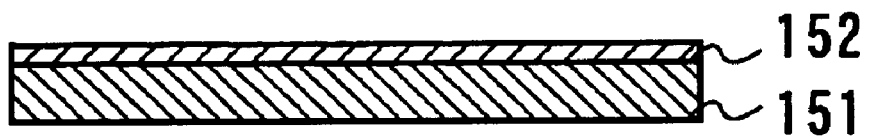
Figure 33A:
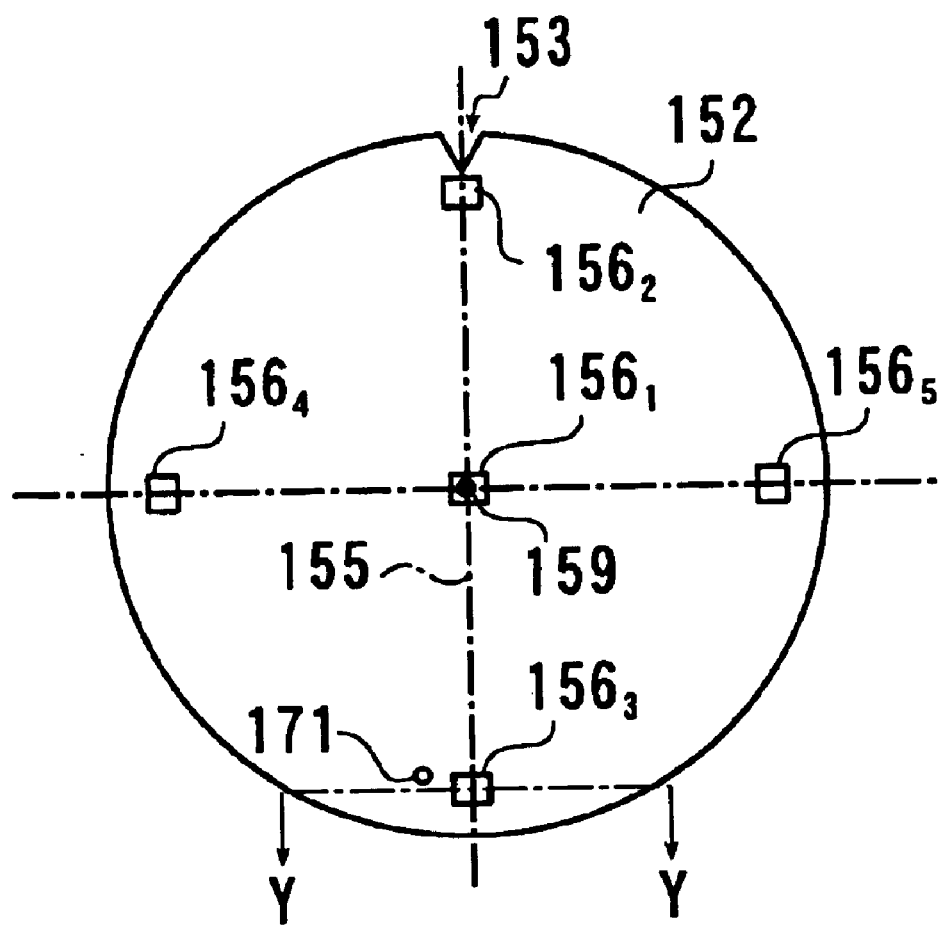
FIG. 33($a$) is an explanatory plan view illustrating a conventional method for measuring film thickness, and FIG. 33($b$) is an explanatory cross sectional view illustrating the conventional method for measuring film thickness.
Figure 33B:
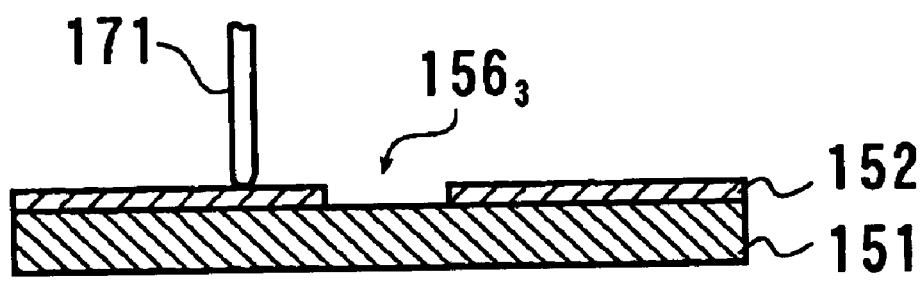

Inside the measurement chamber 77, provided is a film-thickness measurement apparatus 11' which has generally the same configuration as that of the film-thickness measurement apparatus 11 of FIG. 2. FIG. 31 is a cross-sectional view illustrating the apparatus 11'. FIG. 31 is a cross-sectional view taken along K—K of FIG. 30. When a wafer 50 is transferred among the first to fourth processing chambers 71–74 and the loader/unloader chamber 75 in the multi-chamber system 82, the wafer 50 is brought into the measurement chamber 77 to determine the center axis line of the surface of the wafer 50 at the axis determination portion 93 in the measurement chamber 77. In accordance with the center axis line, the film-thickness measurement portion 95 is capable of measuring the thickness of the thin metal film on the surface of the wafer 50.

The film-thickness measurement apparatus 11' has generally the same configuration as that of the film-thickness measurement apparatus 11 described with reference to FIG. 2. The film-thickness measurement apparatus 11' is different from the film-thickness measurement apparatus 11 in that no vacuum pump 24 is provided, and chuck electrodes $85_1$, $85_2$ are disposed inside the support mount 13 and connected to a power source 86. Unlike the film-thickness measurement apparatus 11 described with reference to FIG. 2, the film-thickness measurement apparatus 11' turns on the power source 86 to apply a DC voltage between the chuck electrodes $85_1$ and $85_2$ with the wafer 50 staying on the surface of the support mount 13. The film-thickness measurement apparatus 11' is thereby capable of clamping the wafer 50 against the surface of the support mount 13 by the electrostatic force.

As an example, when a two-layer metal film is deposited on the surface of the wafer 50, first, all the vacuum valves $78_1$–$78_5$ are closed in advance to evacuate the first to fourth processing chambers 71–74, transfer chamber 69 and measurement chamber 77 to a vacuum, and then the wafer 50 is loaded into the loader/unloader chamber 75 under this condition.

The loader/unloader chamber 75 is then evacuated to a predetermined vacuum, at which the vacuum valve $78_5$ between the loader/unloader chamber 75 and the transfer chamber 69 is opened. Then, the hand 63 of the transfer robot 65 is allowed into the loader/unloader chamber 75, and the wafer 50 is placed onto the hand 63 and then transferred from the loader/unloader chamber 75 to the measurement chamber 77.

The wafer 50 is placed from the hand 63 to the lifters $14_1$–$14_4$ and thereafter transferred onto the surface of the support mount 13 to be placed thereon.

In this condition, like the film-thickness measurement apparatus 11 of FIG. 2, the center and the center axis line of the surface of the wafer 50 are determined to define the coordinates of a given position on the surface of the wafer 50. Then, the measurement sensor portion 16 is successively brought onto the predetermined measurement positions; and the AC voltage source 36 is turned on to apply an AC voltage to the measurement coil 31 and thereby generate an eddy current in the wafer 50. The initial value of the amount of variation in inductance component of the measurement coil 31 is thereby determined for the wafer 50, having no thin film deposited on the surface thereof, in close proximity to the measurement coil 31.

The vacuum valve $78_1$ between the first processing chamber 71 and the transfer chamber 69 is then opened to transfer the wafer 50 from the measurement chamber 77 into the first processing chamber 71.

Subsequently, the vacuum valve $78_1$ between the first processing chamber 71 and the transfer chamber 69 is closed to perform the predetermined deposition processing in the first processing chamber 71.

After the predetermined deposition processing has been completed, the vacuum valve $78_1$ between the first processing chamber 71 and the transfer chamber 69 is opened. The hand 63 is then allowed into the first processing chamber 71 to transfer the wafer 50 onto the hand 63; and thereafter the wafer 50 is transferred from the first processing chamber 71 to the measurement chamber 77.

Like the film-thickness measurement apparatus 11 of FIG. 2, the wafer 50 is then placed onto the lifters $14_1$–$14_4$; and thereafter, onto the support mount 13 to align the center of the wafer 50 with that of the support mount 13.

The wafer 50 is then clamped against the support mount 13 by an electrostatic force.

Subsequently, the measurement sensor portion 16 is successively moved onto each of the measurement positions on the wafer 50 at which the initial value of the amount of variation in inductance component has been determined. At each of the measurement positions, the amount of variation in inductance component is determined, thereby determining the film thickness and the film-thickness distribution of the first layer of thin metal film formed on the wafer surface.

The wafer 50 is then placed onto the hand 63, and the vacuum valve $78_2$ between the second processing chamber 72 and the transfer chamber 69 is opened. The wafer 50 is then transferred into the second processing chamber 72; and then, the vacuum valve $78_2$ between the second processing chamber 72 and the transfer chamber 69 is closed.

Subsequently, the second layer of thin metal film is deposited on the surface of the wafer 50 in the second processing chamber 72. At this time, in accordance with the film-thickness distribution of the first layer of thin metal film, the deposition conditions are determined for the second layer of thin metal film. The second layer of thin metal film is deposited according to those deposition conditions.

After the second layer of thin metal film has been deposited as described above, the vacuum valve 782 between the second processing chamber 72 and the transfer chamber 69 is opened as well as the vacuum valve $78_5$ between the loader/unloader chamber 75 and the transfer chamber 69 is opened. The hand 63 is then allowed into the second processing chamber 72 to transfer the wafer 50 onto the hand 63; and then, the wafer 50 is transferred from the second processing chamber 72 to the loader/unloader chamber 75. Thereafter, the vacuum valve $78_5$ between the loader/unloader chamber 75 and the transfer chamber 69 is closed to bring the loader/unloader chamber 75 back into atmospheric pressure, and the wafer 50 is then taken out of the loader/unloader chamber 75. As described above, the present invention makes it possible to easily determine the thickness and the thickness distribution of a thin film without taking the wafer 50 out of the multi-chamber system 82.

Incidentally, in each of the aforementioned embodiments, the amount of variation in inductance component of the measurement coil 31 is measured with the Maxwell's inductance bridge. However, the present invention is not limited thereto but may employ any apparatus so long as the apparatus is able to measure the amount of variation in inductance component of the measurement coil 31 with high accuracy.

Figure 34:
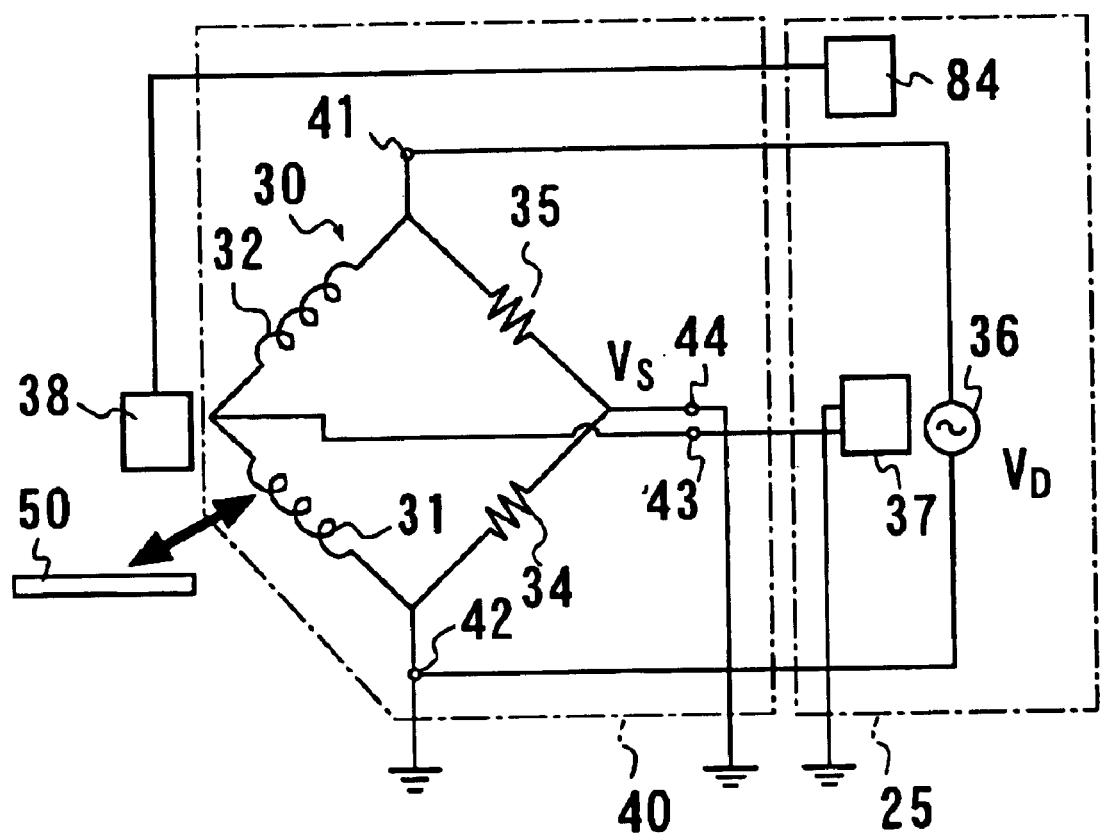
FIG. 34 is an explanatory view illustrating a film-thickness measurement apparatus according to still another embodiment of the present invention.

In addition, in each of the aforementioned embodiments, the two output terminals 43, 44 of the inductance bridge 30 are connected to the two inputs of the film-thickness measurement system 37, as shown in the circuit diagram of FIG. 5, in order to measure the voltage between the output terminals 43 and 44 to thereby obtain the variation in inductance component. However, the present invention is not limited thereto. For example, as shown in FIG. 34, the present invention may be adapted such that the output terminal 44 and one input of the film-thickness measurement system 37 are grounded together, while the output terminal 43 is connected to the other input of the film-thickness measurement system 37, thereby measuring the voltage appearing at the output terminal 43.

Furthermore, this embodiment is adapted to rotate the substrate and extend or retract the measurement sensor portion 16. However, for example, the substrate may be moved in the X-direction and the measurement sensor portion 16 may scan across the substrate in the Y-direction, thereby allowing the entire surface of the substrate to be measured. It is possible to realize a more compact film-thickness measurement apparatus by providing the notch detection mechanism as close to the film-thickness measurement mechanism as possible.

The present invention makes it possible to determine easily and quickly the film-thickness distribution of a thin film on the surface of the substrate without requiring a complicated operation.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. An axis determination apparatus for determining a center axis line of a surface of a circular substrate, comprising a support mount for supporting said substrate placed on a surface thereof, a drive mechanism for rotating said support mount in a plane containing the surface of said support mount, a light-emitting device disposed near a circumferential portion of said support mount, and a light-receiving device disposed, opposite to said light-emitting device, near said circumferential portion of said support mount, said light-emitting device emitting a beam of light to said light-receiving device, wherein said light-receiving device is disposed so as to receive said beam of light emitted by said light-emitting device only through a notch provided on a circumferential portion of said substrate when said notch is aligned between said light-emitting device and said light-receiving device, and said light-receiving device does not receive emitted light when said notch is not so aligned, a lifter including a support member arranged on a circle greater than said support mount in diameter and a projected member projected towards a center of said circle, for supporting said substrate and a circumferential portion of said substrate sitting on said projected member, and a lifting mechanism for hoisting and lowering said lifter near said support mount, wherein an inclined surface sloped towards said projected member is provided on said support member and said lifter transfers said substrate onto a surface of said support mount when said lifter is lowered below said support mount while supporting said substrate, where the center of said substrate is aligned with the center of the support mount, thereby determining the center of said substrate.

2. The axis determination apparatus according to claim 1, wherein said substrate is clamped against said support mount via vacuum.

3. A film-thickness measurement apparatus comprising:
an axis determination apparatus for determining a center axis line of a surface of a circular substrate surface; and
a first measurement apparatus for measuring a thickness of an electrically conductive thin film formed on said substrate surface, said first measurement apparatus determines a measurement position on said substrate surface to measure the thickness of said electrically conductive thin film at said measurement position in accordance with a determined center axis line,
said axis determination apparatus comprising:
a support mount for supporting said substrate placed on a surface thereof,
a drive mechanism for rotating said support mount in a plane containing said surface of said support mount,
a light-emitting device disposed near a circumferential portion of said support mount, and
a light-receiving device disposed opposite of said light-emitting device, and near said circumferential portion of said support mount,
wherein said light-receiving device is disposed so as to receive a beam of light emitted by said light-emitting device only through a notch provided on a circumferential portion of said substrate when said notch is aligned between said light-emitting device and said light-receiving device, and said light-receiving device does not receive emitted light when said notch is not so aligned.

4. The film-thickness measurement apparatus according to claim 3, said first measurement apparatus comprises:
a film-thickness sensor comprising a measurement coil,
a power source for generating an eddy current in said electrically conductive thin fun, by applying AC voltage to said measurement coil when said substrate is in close proximity to said measurement coil, and
a signal measurement device configured to measure a signal generated in said measurement coil by said eddy current.

5. The film-thickness measurement apparatus according to claim 4, said film-thickness sensor comprises:
a reference coil connected in series to said measurement coil and arranged to stay farther away from said substrate than said measurement coil when said measurement coil faces said substrate, and
two reference resistors connected in series to each other, the serially-connected circuit of said two reference resistors being connected in parallel to the serially-connected circuit of said measurement coil and said reference coil,
wherein said signal measurement device is configured to measure a potential difference between the connection of said measurement coil and said reference coil and the connect of said two reference resistors, as a signal generated in said measurement coil when AC voltage is applied to both ends of the serially-connected circuit of said measurement coil and said reference coil.

6. A deposition apparatus comprising:
deposition means for depositing a thin film on a circular substrate surface, and a film-thickness measurement apparatus, comprising:
an axis determination apparatus fro determining a center axis line of said circular substrate surface, and
a first measurement apparatus for measuring thickness of an electrically conductive thin film formed on said circular substrate surface, said first measurement apparatus determines a measurement position on said circular substrate surface to measure said thickness of said electrically conductive thin film at said measurement position in accordance with said center axis line determined by said axis determination apparatus,
said axis determination apparatus comprising:
a support mount for supporting said substrate placed on a surface thereof,
a drive mechanism for rotating said support mount in a plane containing the surface of said support mount,
a light-emitting device disposed near a circumferential portion of said support mount, and
a light receiving device disposed opposite to said light-emitting device, near the circumferential portion of said support mount,
wherein said light-emitting device is disposed so as to receive a beam of light emitted by said light-emitting device only through a notch provided on a circumferential portion of said substrate when said notch is aligned between said light-emitting device and said light-receiving device, and said light-receiving device does not receive emitted light when said notch is not aligned.

7. An axis determination method for determining a center axis line of a circular substrate surface having a notch provided on a circumferential portion of said substrate, comprising the steps of:
first determining a center of said circular substrate surface to provide a determined center;
second determining notch position to provide determined notch position, comprising irradiating said circumferential portion of said substrate with a beam of light emitted from a light-emitting device, while rotating said substrate in a plane containing said substrate surface with said determined center, to interpose the circumferential portion of said substrate between said light-emitting device and a light-receiving device disposed opposite to said light-emitting device, thereby determining said notch position upon said light-receiving device receiving emitted light, and
third determining the center axis line of said circular substrate surface in accordance with said determined notch position and said determined center.

8. A film-thickness measurement method for measuring a thickness of a film, comprising the steps of:
first determining a center of said circular substrate surface to provide a determined center, said substrate comprising a notch provided on a circumferential portion of said substrate and an electrically conductive thin film deposited on said substrate surface;
second determining notch position to provide a determined notch position, comprising irradiating said circumferential portion of said substrate with a beam of light emitted from a light-emitting device, while rotating said substrate in a plane containing said substrate surface with said determined center to interpose the circumferential portion of said substrate between said light-emitting device and a light-receiving device disposed opposite to said light-emitting device, thereby determining said notch position upon said light-receiving device receiving emitted light, third determining the center axis line of said substrate surface in accordance with said determined notch position and determined center;

forth determining a measurement position on said substrate surface in accordance with said center axis line; and measuring the thickness of said electrically conductive thin film at said measurement position.

9. The film-thickness measurement method according to claim 8, said steps of measuring comprising the steps of:

providing a measurement coil in close proximity to said substrate, generating an eddy current in said electrically conductive thin film comprising applying AC voltage to said measurement coil; and detecting a signal produced in said measurement coil by said eddy current, to determine the thickness of said electrically conductive thin film in accordance with said signal.

10. The film-thickness measurement method according to claim 9, said step of detecting further comprising the steps of:

preparing a Maxwell inductance bridge by connecting a serially-connected circuit of two reference resistors in parallel to a serially-connected circuit of a measurement coil and a reference coil, said serially-connected circuit of two reference resistors having two reference resistors connected in series to each other, said reference coil connected in series to said measurement coil being disposed at a position farther away from said substrate than said measurement coil, and determining a variation in inductance component of said measurement coil and thereby detect a signal produced in said measurement coil by using said Maxwell inductance bridge.

11. The axis determination apparatus according to claim 1, comprising a plurality of said lifters wherein support members are arranged on a same circle greater than said support mount in diameter respectively and projected members are projected towards a center of said circle in diameter respectively.

* * * * *